US012666957B2

(12) United States Patent
Yang et al.

(10) Patent No.: US 12,666,957 B2
(45) Date of Patent: Jun. 23, 2026

(54) ANTI-FUSE CELLS WITH BACKSIDE POWER RAILS

(71) Applicant: Taiwan Semiconductor Manufacturing Company Ltd., Hsinchu (TW)

(72) Inventors: I-Hsin Yang, Hsinchu (TW); Meng-Sheng Chang, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 136 days.

(21) Appl. No.: 18/428,920

(22) Filed: Jan. 31, 2024

(65) Prior Publication Data

US 2025/0070018 A1 Feb. 27, 2025

Related U.S. Application Data

(60) Provisional application No. 63/520,834, filed on Aug. 21, 2023.

(51) Int. Cl.
*G11C 17/16* (2006.01)
*G11C 17/18* (2006.01)
(Continued)

(52) U.S. Cl.
CPC ........... *H10W 20/491* (2026.01); *G11C 17/16* (2013.01); *G11C 17/18* (2013.01); *H10B 20/25* (2023.02);
(Continued)

(58) Field of Classification Search
CPC .............................. H01L 23/5252; G11C 17/16
(Continued)

(56) References Cited

U.S. PATENT DOCUMENTS 7,002,198 B2 * 2/2006 Salling ................... H10B 51/00
257/295
2006/0060910 A1 * 3/2006 Yang ...................... H10D 30/69
438/257
(Continued)

FOREIGN PATENT DOCUMENTS

CN 218417157 U 1/2023
TW 202310337 A 3/2023

OTHER PUBLICATIONS

Office Action issued in connection with Taiwan Appl. No. 113115868 dated Jan. 9, 2025.

*Primary Examiner* — Muna A Techane
(74) *Attorney, Agent, or Firm* — Foley & Lardner LLP

(57) ABSTRACT

A device includes a memory cell including a first transistor and a second transistor disposed on a frontside of a substrate, the substrate having a first area and a second area. The memory device includes a first interconnect structure disposed on a backside of the substrate. One S/D terminal of the first transistor is coupled to one S/D terminal of the second transistor, with the other S/D terminal of the second transistor coupled to the first interconnect structure through a first via structure in the first area. The memory device includes second via structures and a third via structure both disposed in the second area and each coupled to the first interconnect structure. The first via structure and the second via structures each have a cross-sectional area that is different from that of the third via structure.

20 Claims, 30 Drawing Sheets

(51) Int. Cl.
| | |
|---|---|
| *H10B 20/25* | (2023.01) |
| *H10W 20/49* | (2026.01) |
| *H10W 20/41* | (2026.01) |

(52) U.S. Cl.
CPC ........ *H10W 20/427* (2026.01); *H10W 20/435* (2026.01)

(58) Field of Classification Search
USPC ........................................................ 365/96
See application file for complete search history.

(56) References Cited

U.S. PATENT DOCUMENTS

| | | | |
|---|---|---|---|
| 2015/0348981 A1* | 12/2015 | La Rosa ............ | H10D 30/0411 |
| | | | 438/266 |
| 2018/0219015 A1* | 8/2018 | Nelson .................. | G11C 11/419 |
| 2020/0135779 A1* | 4/2020 | Takahashi ........... | H10F 39/8053 |

* cited by examiner

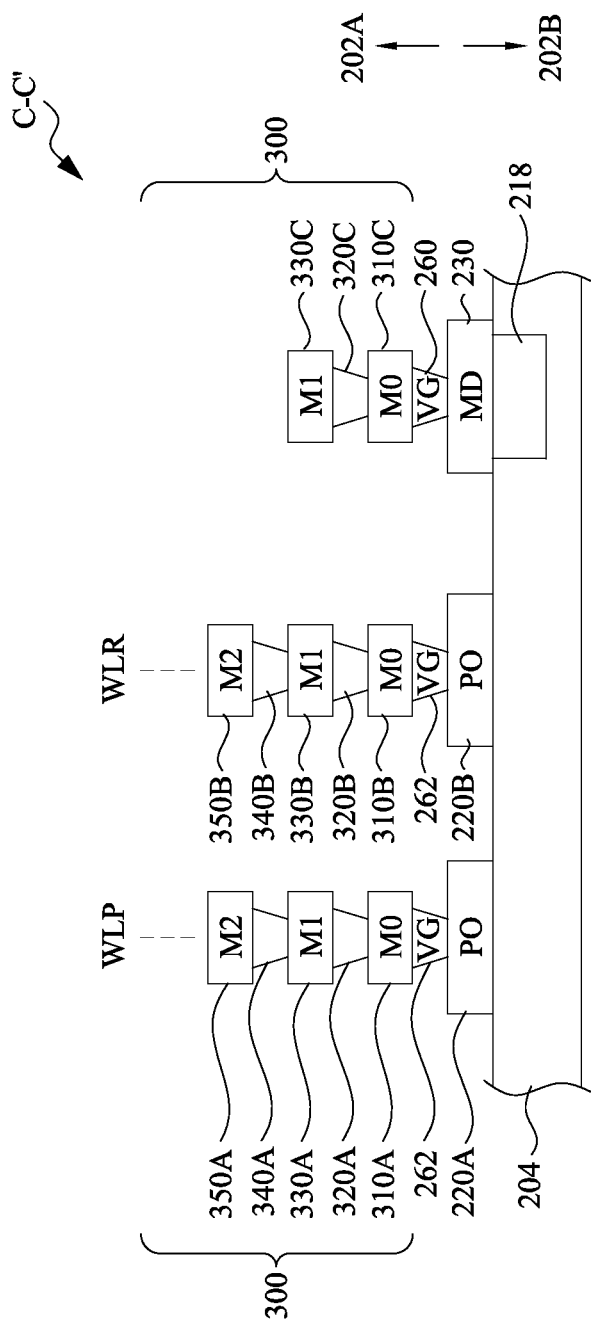
FIG. 25
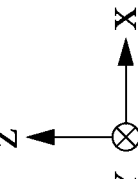

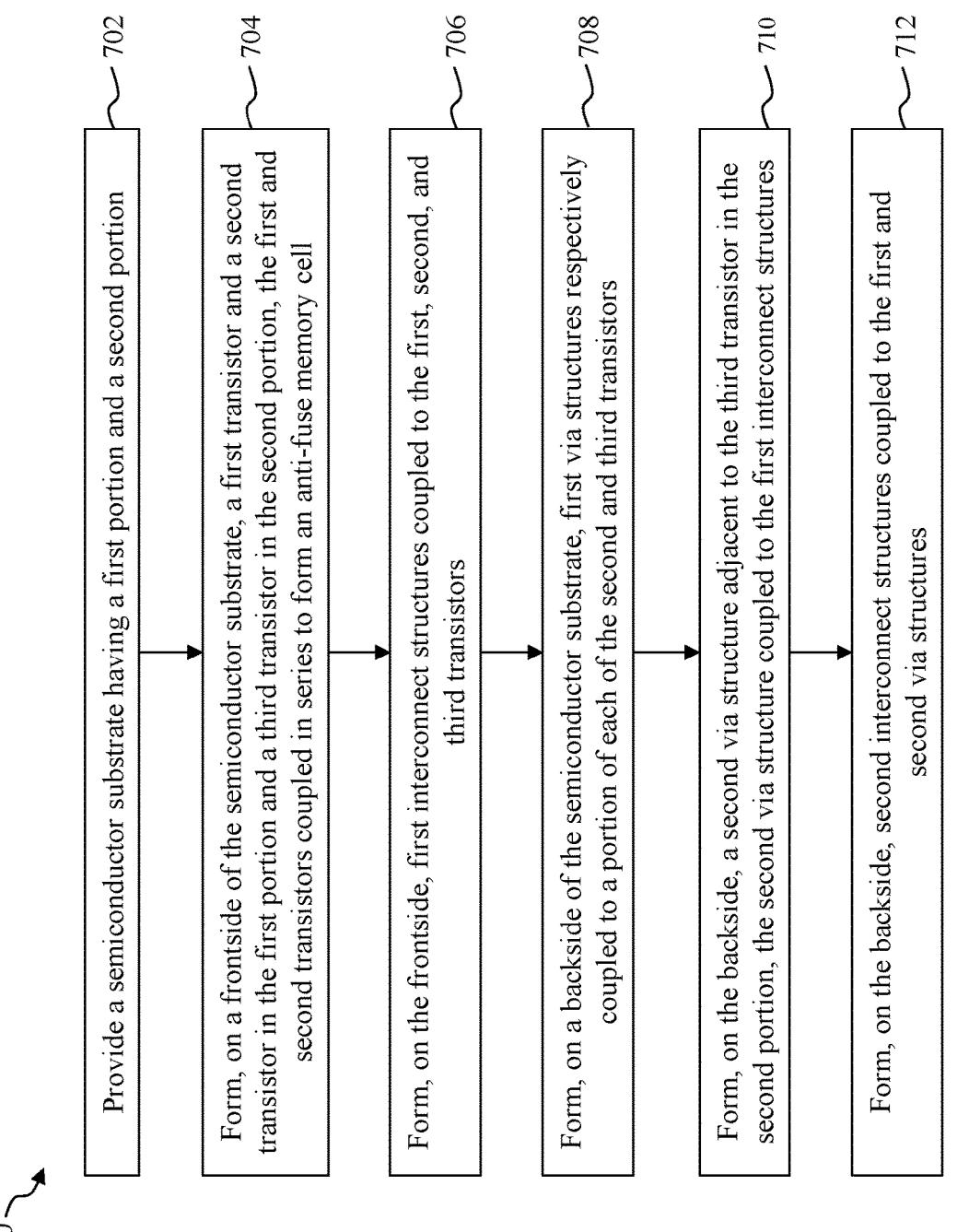

700

702 — Provide a semiconductor substrate having a first portion and a second portion 704 — Form, on a frontside of the semiconductor substrate, a first transistor and a second transistor in the first portion and a third transistor in the second portion, the first and second transistors coupled in series to form an anti-fuse memory cell 706 — Form, on the frontside, first interconnect structures coupled to the first, second, and third transistors 708 — Form, on a backside of the semiconductor substrate, first via structures respectively coupled to a portion of each of the second and third transistors 710 — Form, on the backside, a second via structure adjacent to the third transistor in the second portion, the second via structure coupled to the first interconnect structures 712 — Form, on the backside, second interconnect structures coupled to the first and second via structures

FIG. 35

ANTI-FUSE CELLS WITH BACKSIDE POWER RAILS

CROSS-REFERENCE TO RELATED APPLICATION

This application claims priority to and the benefit of U.S. Provisional Application No. 63/520,834, filed Aug. 21, 2023, entitled "ANTI-FUSE CELLS WITH BACKSIDE POWER RAILS," which is incorporated herein by reference in its entirety for all purposes.

BACKGROUND

Integrated circuits (ICs) sometimes include one-time-programmable (OTP) memories to provide non-volatile memory (NVM) in which data are not lost when the IC is powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor coupled in series. A gate dielectric of the programming MOS transistor may be broken down to cause the gate and the source or drain of the programming MOS transistor to be interconnected. Depending on whether the gate dielectric of the programming MOS transistor is broken down, different data bits can be presented by the anti-fuse memory cell through reading a resultant current flowing through the programming MOS transistor and reading MOS transistor. The anti-fuse memories have the advantageous features of reverse-engineering proofing, since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8, 12, 17, 21, and 25 each illustrate a schematic cross-sectional view along line CC' of the example memory cell of FIGS. 4, 11, 16, and 24, respectively, in accordance with some embodiments.

FIG. 35 illustrates a flow chart of an example method for making one or more memory cells on a frontside of a substrate that are coupled with interconnect structures on a backside of the substrate, in accordance with some embodiments.

DETAILED DESCRIPTION

Figure 1:
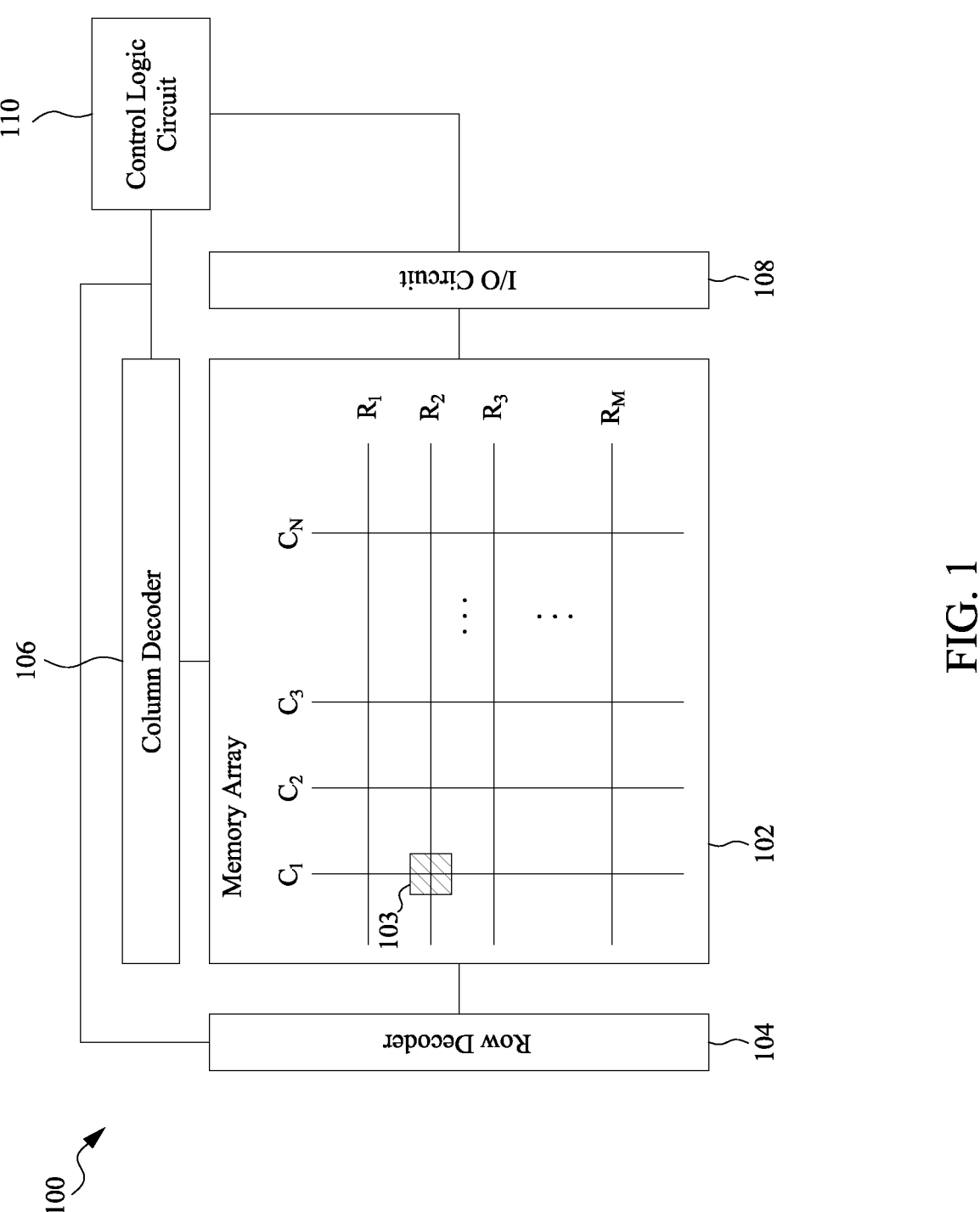
FIG. 1 illustrates a block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, cells of an anti-fuse memory are formed as an array. The array includes a number of rows and a number of columns, with at least one cell disposed at an intersection of one of the rows and one of the columns. Each cell can be accessed through a respective combination of a first access line disposed along the corresponding row (e.g., a word line (WL)) and a second access line disposed along the corresponding column (e.g., a bit line (BL)). With such an array configuration, programming transistors of a number of cells may share one of the WLs, while their reading transistors are coupled to different BLs, respectively. As technology node continues to shrink, providing power (e.g., voltage) to a large quantity of memory cells (e.g., anti-fuse memory cells) in such an array through frontside power rails becomes challenging due to increased device densities for a given device footprint. Thus, improvements are desired with respect to routing options for anti-fuse memory arrays at reduced length scales.

The present disclosure provides various embodiments of an anti-fuse memory device including a number of anti-fuse memory cells formed on a frontside of a substrate. The anti-fuse memory cells each include at least one or more pairs of a programming transistor and a reading transistor coupled in series, where one of the source/drain terminals of the reading transistor is coupled to a bit line (BL). In many embodiments, the BL is disposed on a backside of the substrate as a part of a backside power rails implemented as backside interconnect structures. In some embodiments, the backside power rails are coupled to the anti-fuse memory cells through a plurality of via structures including, for example, backside vias and feedthrough vias. In some embodiments, the voltage applied at the BL is delivered through similar via structures coupled to dummy transistors formed in a tap region adjacent to the anti-fuse memory cell. By adjusting the placement of the via structures, resistance in a conduction path between the BL and the anti-fuse memory cell can be adjusted (e.g., optimized) to improve device performance.

FIG. 1 illustrates a memory device 100, in accordance with various embodiments. In the illustrated embodiment of FIG. 1, the memory device 100 includes a memory array 102, a row decoder 104, a column decoder 106, an input/output (I/O) circuit 108, and a control logic circuit 110. Despite not being shown in FIG. 1, all of the components of the memory device 100 may be operatively coupled to each other and to the control logic circuit 110. Although, in the illustrated embodiment of FIG. 1, each component is shown as a separate block for the purpose of clear illustration, in some other embodiments, some or all of the components shown in FIG. 1 may be integrated together. For example, the memory array 102 may include an embedded I/O circuit 108. The terms "couple" and "connect," as used herein, refer to electrical or otherwise operative connection between two components with or without any intervening layers or components formed therebetween. As such, unless stated explicitly, the terms "coupled," "connected," "electrically coupled," and "operatively coupled" are used interchangeably in the present disclosure.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1$, $R_2$, $R_3$ ... $R_M$, each extending in a first direction (e.g., X-direction) and a number of columns $C_1$, $C_2$, $C_3$ ... $C_N$, each extending in a second direction (e.g., Y-direction). Each of the rows/columns may include one or more conductive structures each configured as an access line (e.g., a programming word line (WLP), a reading word line (WLR), a bit line (BL)), which will be discussed below. In some embodiments, each memory cell 103 is arranged in the intersection of a corresponding row and a corresponding column and can be operated according to voltages or currents through the respective conductive structures of the column and row.

In some aspects of the present disclosure, each memory cell 103 is implemented as an anti-fuse memory cell that includes a first set of transistors and a second set of transistors coupled in series. The first set of transistors can each function as a programming transistor of the memory cell, and the second sets of transistors can each function as a reading transistor of the memory cell. At least one of the first set of transistors can be gated by a WLP; and the second set of transistors can be gated by a WLR. Although the present disclosure is directed to implementing the memory cell 103 as an anti-fuse memory cell, it should be understood that the memory cell 103 can include any of various other memory cells, while remaining within the scope of present disclosure.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108).

Figure 2:
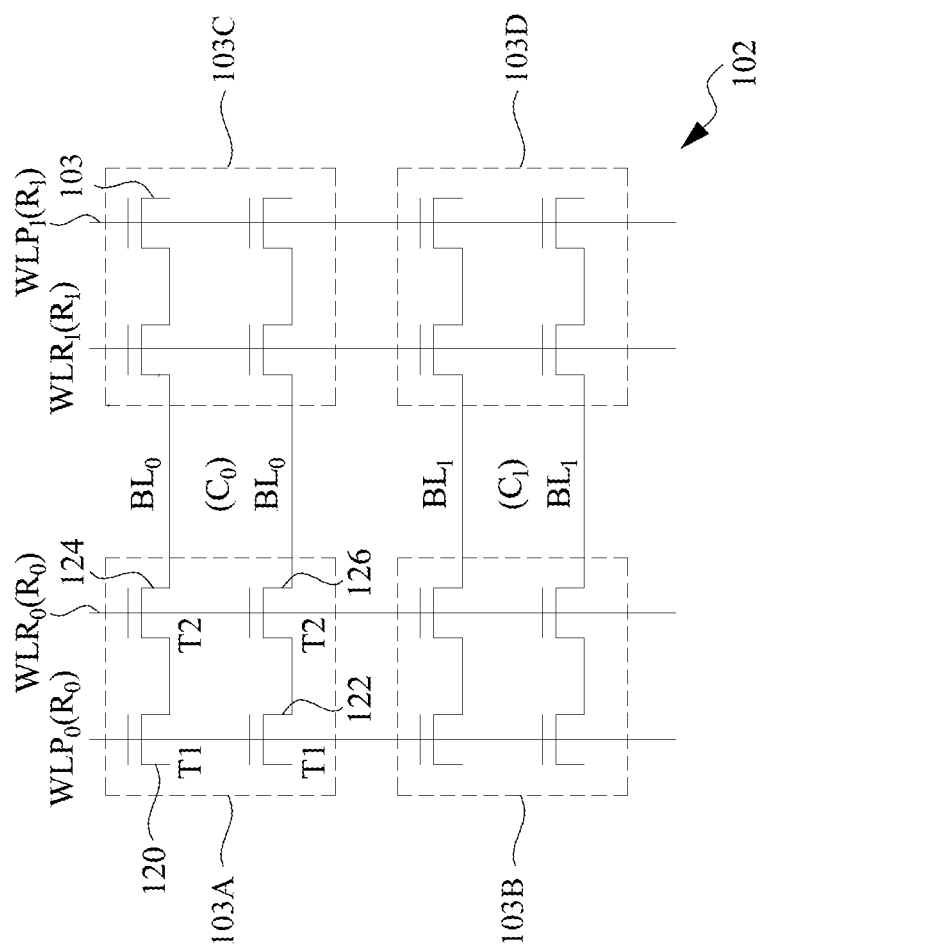
FIG. 2 illustrates an example circuit diagram of a portion of the memory device of FIG. 1, in accordance with some embodiments.

FIG. 2 illustrates an example circuit diagram of a portion of the memory device 100 (e.g., some of the memory cells 103), in accordance with some embodiments. In the illustrated example of FIG. 2, anti-fuse memory cells 103A, 103B, 103C, and 103D of the memory array 102 are shown. Although four anti-fuse memory cells 103A-D are shown, it should be appreciated that the memory array 102 can have any number of anti-fuse memory cells, while remaining within the scope of present disclosure.

As described above, the memory cells 103 can be arranged as an array. In FIG. 2, the memory cells 103A and 103B may be disposed in a same row but in respectively different columns; and the memory cells 103C and 103D may be disposed in a same row but in respectively different columns. For example, the memory cells 103A and 103B are disposed in row $R_0$, but in columns $C_0$ and $C_1$, respectively; and the memory cells 103C and 103D are disposed in row $R_1$, but in columns $C_0$ and $C_1$, respectively. With such a configuration, each of the memory cells can be operatively coupled to the access lines in the corresponding row and column, respectively.

For example in FIG. 2, the memory cell 103A is operatively coupled to a programming word line and a reading word line in row $R_0$ (hereinafter $WLP_0$ and $WLR_0$, respectively) and to a bit line in column $C_0$ (hereinafter $BL_0$); the memory cell 103B is operatively coupled to the $WLP_0$ and $WLR_0$ in the row $R_0$ and to a bit line in column $C_1$ (hereinafter $BL_1$); the memory cell 103C is operatively coupled to a programming word line and a reading word line in row $R_1$ (hereinafter $WLP_1$ and $WLR_1$, respectively) and to the $BL_0$ in column $C_0$; and the memory cell 103D is operatively coupled to the $WLP_1$ and $WLR_1$ in row $R_1$ and to the $BL_1$ in column $C_1$.

In some embodiments, each of the memory cells 103A-103D can be operatively coupled to the I/O circuit 108 through the respective WLR, WLP, and BL for being accessed (e.g., programmed, read). For example, the I/O circuit 108 can cause the row decoder 104 to assert the $WLP_0$ and $WLR_0$ and the column decoder 106 to assert the $BL_0$, so as to access the memory cell 103A through the $WLP_0$, $WLR_0$, and $BL_0$. Accordingly, each of the memory cells 103A-D can be individually selected to be programmed or read. Details of programming and reading the memory cell will be discussed below.

Each of the memory cells 103A-103D includes a number of programming transistors and a number of reading transistors, wherein each of the programming transistors is coupled to a corresponding one of the reading transistors in series. Further, at least two of the programming transistors are separately gated, while the reading transistors may be commonly gated, in accordance with various embodiments. The memory cell 103A is selected as a representative example in the following discussions.

As shown in FIG. 2, the memory cell 103A includes programming transistors (T1) 120 and 122, and the reading transistors (T2) 124 and 126. The programming transistor 120 is coupled to the reading transistor 124 in series; and the programming transistor 122 is coupled to the reading transistor 126 in series. One source/drain terminal of each of the programming transistors 120 and 122 are floating (i.e., not connected to any other functioning features); and the other source/drain terminal of each of the programming transistors 120 and 122 is serially coupled to one source/drain terminal of the corresponding reading transistor 124/126, with the other source/drain terminals of the reading transistors 124 and 126 commonly coupled to the $BL_0$. In some embodiments, a programming transistor (e.g., the programming transistor 120) coupled in series with a reading transistor (e.g., the reading transistor 124) is considered a unit cell (e.g., a building block) of an anti-fuse memory device.

Further, the programming transistor 120 is gated by the $WLP_0$ (i.e., a gate terminal of the programming transistor 120 is coupled to the $WLP_0$), while a gate terminal of the programming transistor 122 may not be coupled to (or otherwise disconnected from) the $WLP_0$. On the other hand, the reading transistors 124 and 126 are both gated by the $WLR_0$ (i.e., both gate terminals of the reading transistors 124 and 126 are coupled to the $WLR_0$).

Figure 3:
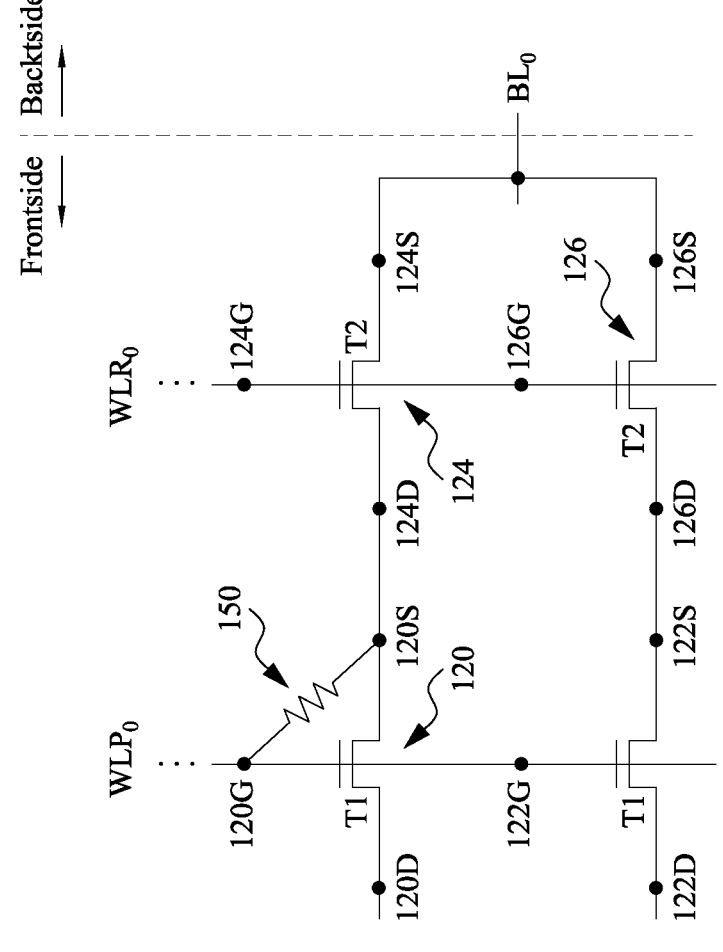
FIG. 3 illustrates an example circuit diagram of a memory cell of the memory device of FIGS. 1 and 2, in accordance with some embodiments.

Referring to FIG. 3, provided is a further detailed circuit diagram of the memory cell 103A to illustrate operations of each of the memory cells 103, in accordance with some embodiments. As shown, each of the programming/reading transistors, 120 to 126, may include an n-type metal-oxide-semiconductor field-effect-transistor (n-type MOSFET) or sometimes referred to as an NMOS transistor. However, it should be understood that each of the programming/reading transistors, 120 to 126, may include a p-type metal-oxide-semiconductor field-effect-transistor (p-type MOSFET), while remaining within the scope of present disclosure.

Specifically, the programming transistors 120 and 122 have their respective drain terminals 120D and 122D floating (e.g., coupled to nothing functional), and their respective source terminals 120S and 122S coupled to drain terminals of the reading transistors 124 and 126, 124D and 126D, respectively. Source terminals of the reading transistors 124 and 126, 124S and 126S, are commonly coupled to the $BL_0$. The programming transistor 120 has a gate terminal 120G coupled to the $WLP_0$, while the programming transistor 122 has a gate terminal 122G isolated from the $WLP_0$. On the other hand, the reading transistors 124 and 126 have their respective gate terminals, 124G and 126G, commonly coupled to the $WLR_0$.

To program the memory cell 103A, the reading transistors 124 and 126 are turned on by supplying a high enough voltage (e.g., a positive voltage corresponding to a logic high state) to the gate terminals 124G and 126G via the $WLR_0$. Prior to, concurrently with or subsequently to the reading transistors 124 and 126 being turned on, a sufficiently high voltage (e.g., a breakdown voltage ($V_{BD}$) which is sometimes referred to as a programming voltage) is applied to the $WLP_0$, and a low enough voltage (e.g., a positive voltage or ground voltage corresponding to a logic low state) is applied to the $BL_0$. The low voltage applied on the $BL_0$ can be passed to the source terminal 120S such that $V_{BD}$ will be present across the source terminal 120S and the gate terminal 120G thereby causing a breakdown of a portion of a gate dielectric (e.g., the portion between the source terminal 120S and the gate terminal 120G) of the programming transistor 120.

After the gate dielectric of the programming transistor 120 is broken down, a behavior of the portion of the gate dielectric interconnecting the gate terminal 120G and the source terminal 120S is equivalently resistive. For example, such a portion may function as a resistor 150, as shown in FIG. 3. Before the programming (before the gate dielectric of the programming transistor 120 is broken down), no conduction path exists between the $BL_0$ and the $WLP_0$, even if the reading transistors 124 and 126 are turned on. After the programming, a conduction path exists between the $BL_0$ and the $WLP_0$ (e.g., through the resistor 150), when the reading transistors 124 and 126 are turned on.

To read the memory cell 103A, similarly to the programming, the reading transistors 124 and 126 are turned on via the $WLR_0$, and the $BL_0$ is coupled to a voltage corresponding to the logic low state. In response, a positive voltage is applied to the gate terminal of the programming transistor 120 through the $WLP_0$. As discussed above, if the gate dielectric of the programming transistor 120 is not broken down, no conduction path exists between the $BL_0$ and the $WLP_0$. Thus, a relatively low current conducts from the $WLP_0$, through the transistors 120 and both transistors 124 and 126, and to the $BL_0$. If the gate dielectric of the programming transistor 120 is broken down, a conduction path exists between the $BL_0$ and the $WLP_0$. Thus, a relatively high current conducts from the $WLP_0$, through the transistor 120 (now equivalent to the resistor 150) and both transistor 124 and 126, and to the $BL_0$. Such a low current and high current may sometimes be referred to as $I_{off}$ and $I_{on}$ of the memory cell 103A, respectively. A circuit component (e.g., a sense amplifier) of the I/O circuit 108 (FIG. 1), coupled to the $BL_0$ can differentiate $I_{off}$ from $I_{on}$ (or vice versa), and thus determine whether the memory cell 103A presents a logic high ("1") or a logic low ("0"). For example, when $I_{on}$ is read, the memory cell 103A may present 1; and when $I_{off}$ is read, the memory cell 103A may present 0.

In accordance with various embodiments of the present disclosure, the programming transistors T1 (e.g., the programming transistors 120 and 122) and the reading transistors T2 (e.g., the reading transistors 124 and 126) are formed on the same side, e.g., the frontside of the of a semiconductor substrate (or substrate), while voltage applied to the BL (e.g., the $BL_0$) of the anti-fuse memory cell 103 is provided from power rails disposed on an opposite side, i.e., the backside, of the substrate through various types of via structures. Such backside power rails, which include backside metallization layers, may alternatively be referred to as backside interconnect structures throughout the present disclosure. In other words, the backside interconnect structures operatively serve as the BL for the anti-fuse memory cell 103. Accordingly, upon applying a program voltage to a gate terminal (e.g., the gate terminal 120G) of the programming transistor T1 (e.g., the programming transistor 120) through a WL (e.g., the $WLP_0$), a conduction (e.g., programming) path extends from the gate terminal, through at least a source/drain terminal (e.g., the source terminal 120S) of the programming transistor T1, both of the source/drain termi-
nals (e.g., the drain terminal 124D and the source terminal
124S) of the reading transistor T2, a plurality of via struc-
tures, such as backside vias and/or feedthrough vias, and to
the backside interconnect structures. This configuration dif-
fers from existing conventional anti-fuse memory cell
designs in which the voltage applied at the BL is typically
provided from the frontside, such as through the frontside
interconnect structures. In this regard, the anti-fuse memory
cell 103 of the present disclosure at least benefits from
additional routing options from the backside of the substrate,
thereby improving flexibility in cell design and/or ease of
manufacturing associated with the fabrication process.

In some embodiments, additional via structures, such as
backside vias and/or feedthrough vias, are incorporated
through dummy transistors coupled to the conduction path
between terminals of the transistors (e.g., the drain terminal
of the reading transistor T2 in a unit cell) and the backside
power rails (i.e., the backside interconnect structures), which
operatively serve as the BL to the anti-fuse memory cell, to
reduce the resistance of the conduction path and improve
device performance in the anti-fuse memory cell 103. In
some embodiments, a gate terminal and both source/drain
terminals of each dummy transistor are coupled to the BL.
In some embodiments, the dummy transistors are formed in
a tap region (e.g., a P-tap region for n-type transistors)
extending, at least partially, adjacent to a device region that
includes the anti-fuse memory cell.

For example, the present disclosure provides anti-fuse
memory cell structures that each include a device region
adjacent to a tap (e.g., pick-up, dummy, guard ring, etc.)
region on a frontside of a substrate, where the device region
includes a plurality of anti-fuse memory unit cells, and
where the tap region includes a plurality of dummy transis-
tors. Each of the anti-fuse memory unit cell may include at
least a programming transistor T1, such as the programming
transistor 120, coupled in series to a reading transistor T2,
such as the reading transistor 124, where the programming
transistor T1 and the reading transistor T2 are collectively
referred to as functional transistors. A source/drain terminal
(e.g., source/drain region 218B of FIG. 5) of the reading
transistor T2 in each of the unit cells is further coupled to a
BL (i.e., a power rail or an interconnect structure) disposed
in a metallization layer on a backside of the substrate. Each
of the dummy transistors has its source terminal, drain
terminal, and gate terminal coupled to the BL disposed in the
backside metallization layer through at least one of the
additional via structures. In this regard, the resistance along
the conduction path can be tuned (e.g., reduced) for a given
applied voltage at the BL. In some embodiments, the pro-
gramming transistors T1 and the reading transistors T2 are
formed as a part of a front-end-of-line (FEOL) processing on
the frontside of the substrate, and a number of metallization
layers, each of which includes a number of metal structures
(e.g., metal lines), are formed over the FEOL processing on
the frontside as a part of frontside interconnect structures of
a frontside back-end-of-line (BEOL) processing. Further-
more, the backside metallization layers are formed as a part
of the backside interconnect structures.

In some embodiments, the placement of the via structures
used for connecting the functional transistors and the
dummy transistors is determined based on, for example, a
size of each via structure with respect to a size of a cell area
available for placement of the via structure. For example, the
backside via, being coupled to and overlapping a source/
drain terminal of the access transistor has a smaller cross-
sectional area compared to a feedthrough via, which typically has an elongated shape in a top view extending parallel
to an active region (e.g., a fin) of the anti-fuse memory cell.
Since resistance generally varies inversely with the cross-
sectional area of a conductor, the resistance of the backside
via is higher than that of the feedthrough via. In some
examples, the resistance of a feedthrough via can be as low
as ⅛ of the resistance of a backside via. Accordingly, for the
device region where cell area is more limited in comparison
to the tap region, more area-efficient backside vias may be
utilized and more feedthrough vias may be utilized in the tap
region. In some embodiments, both backside vias and feed-
through vias are utilized in both the device region and the tap
region.

Figure 4:
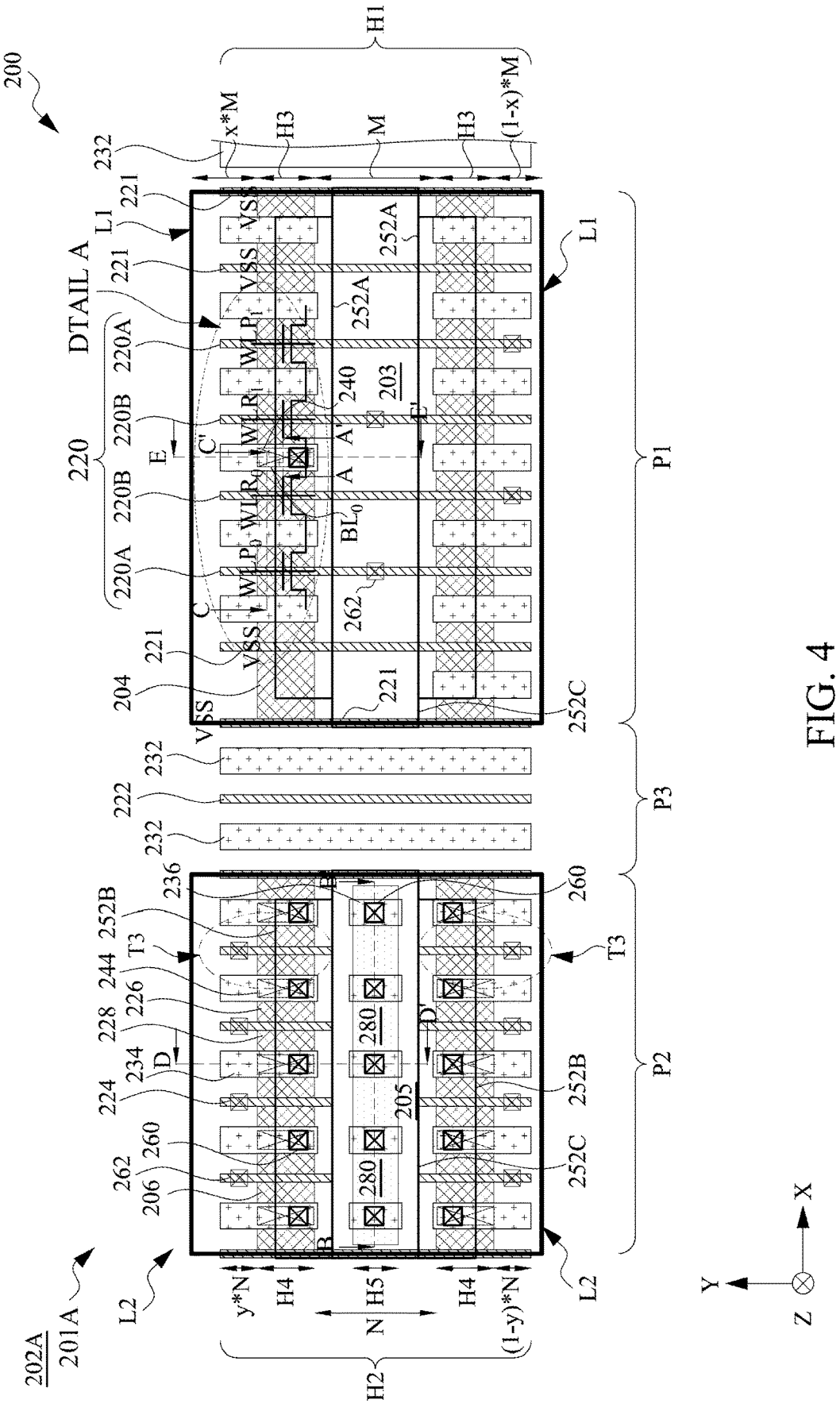
FIGS. 4, 5, 11, 15, 16, 20, 24, 28, 29, and 30 each illustrate a frontside layout design of an example memory cell coupled to backside interconnect structures (e.g., power rails), in accordance with some embodiments.

FIG. 4 illustrates a frontside layout design of a portion of
an example semiconductor device 200. The semiconductor
device 200 includes a plurality of anti-fuse memory cells
201A (e.g., the anti-fuse memory cell 103) disposed over a
frontside 202A of a semiconductor substrate (or substrate)
202 (see FIG. 5, for example). An embodiment of the
anti-fuse memory cell 201A is depicted in FIG. 4. In some
embodiments, the substrate 202 includes a plurality of doped
wells, such as p-type wells and n-type wells for providing
n-type devices (e.g., NMOS devices) and p-type devices
(e.g., PMOS devices), respectively. It is noted that multiple
dielectric components (e.g., FEOL isolation regions of the
anti-fuse memory cell 201A) have been omitted in FIG. 4
and the subsequent figures to lend greater clarity to the
description of various components of the anti-fuse memory
cell 201A.

In the present embodiments, the substrate 202 includes a
first region (e.g., area, portion, etc.) P1, a second region P2,
and a third region P3 interposed between the first region P1
and the second region P2 along a first lateral direction (e.g.,
the X axis). In some embodiments, the first region P1 is
configured as a device region for providing active compo-
nents of the anti-fuse memory cells 201A and the second
region P2 is configured as a tap region adjacent to or
surrounding the first region P1 for separating the first
regions P1 of adjacent anti-fuse memory cells 201A in a
given layout of the semiconductor device 200, among other
functions. The third region P3 may be configured as a
dummy region (e.g., without any devices) and may include
at least one dummy gate structure 222 and at least one
source/drain contact 232 each extending lengthwise along a
second lateral direction (e.g., the Y axis) and interposed
between vertical boundaries of the first region P1 and the
second region P2 along the first lateral direction. In some
embodiments, as depicted herein, the second region P2
extends adjacent to the first region P1 along the second
lateral direction.

The first region P1 has a first cell height H1 and the
second region P2 has a second cell height H2, each of which
is defined along the second lateral direction. In some
embodiments, the cell heights H1 and H2 are the same. In
some embodiments, the cell height H1 is greater than the cell
height H2. In some embodiments, the cell height H2 is
greater than the cell height H1. In some examples, the cell
heights H1 and H2 are each at least about 156 nm. In the
depicted embodiment of FIG. 4, the cell heights H1 and H2
are both about 208 nm.

In the first region P1, the anti-fuse memory cell 201A
includes a plurality of active regions (also each referred to
as an oxide diffusion, or OD, regions) 204 over the frontside
202A of the substrate 202 and separated by isolation regions
(not depicted separately). The active regions 204 each
extend lengthwise along the first lateral direction and are
separated from one another along the second lateral direction. The active regions 204 may each include a monolithic structure, such as a fin active region, for providing fin-like field-effect transistors (FinFETs). Alternatively, the active regions 204 may each include a stack of nanostructures (e.g., nanosheets, nanorods, etc.) for providing gate-all-around (GAA) FETs. Other configurations of the active regions 204 may also be applicable to the anti-fuse memory cell 201A, according to some embodiments of the present disclosure. The active regions 204 each have a height H3 defined along the second lateral direction as depicted in FIG. 4, and adjacent active regions 204 are separated by a distance M, which is also referred to as a height of a dummy region 203 of the substrate 202.

Referring to FIG. 4, the anti-fuse memory cell 201A includes a plurality of gate structures (e.g., functional gate structures) 220A and 220B oriented perpendicular to and over portions of the active regions 204 to define channel regions therein, where each channel region is interposed between a pair of source/drain regions (e.g., source/drain terminals) along the first lateral direction. In some embodiments, portions of the gate structures 220A and 220B, collectively referred to as the gate structures 220, are spaced along the second lateral direction and separated by the dummy region 203. In some embodiments, the anti-fuse memory cell 201A further includes at least one gate structure 221 disposed between an outermost one of the gate structures 220 and the third region P3. The gate structure 221 serves as a dummy gate structure to be coupled to the ground ($V_{ss}$) of the anti-fuse memory cell 201A.

Figure 5:
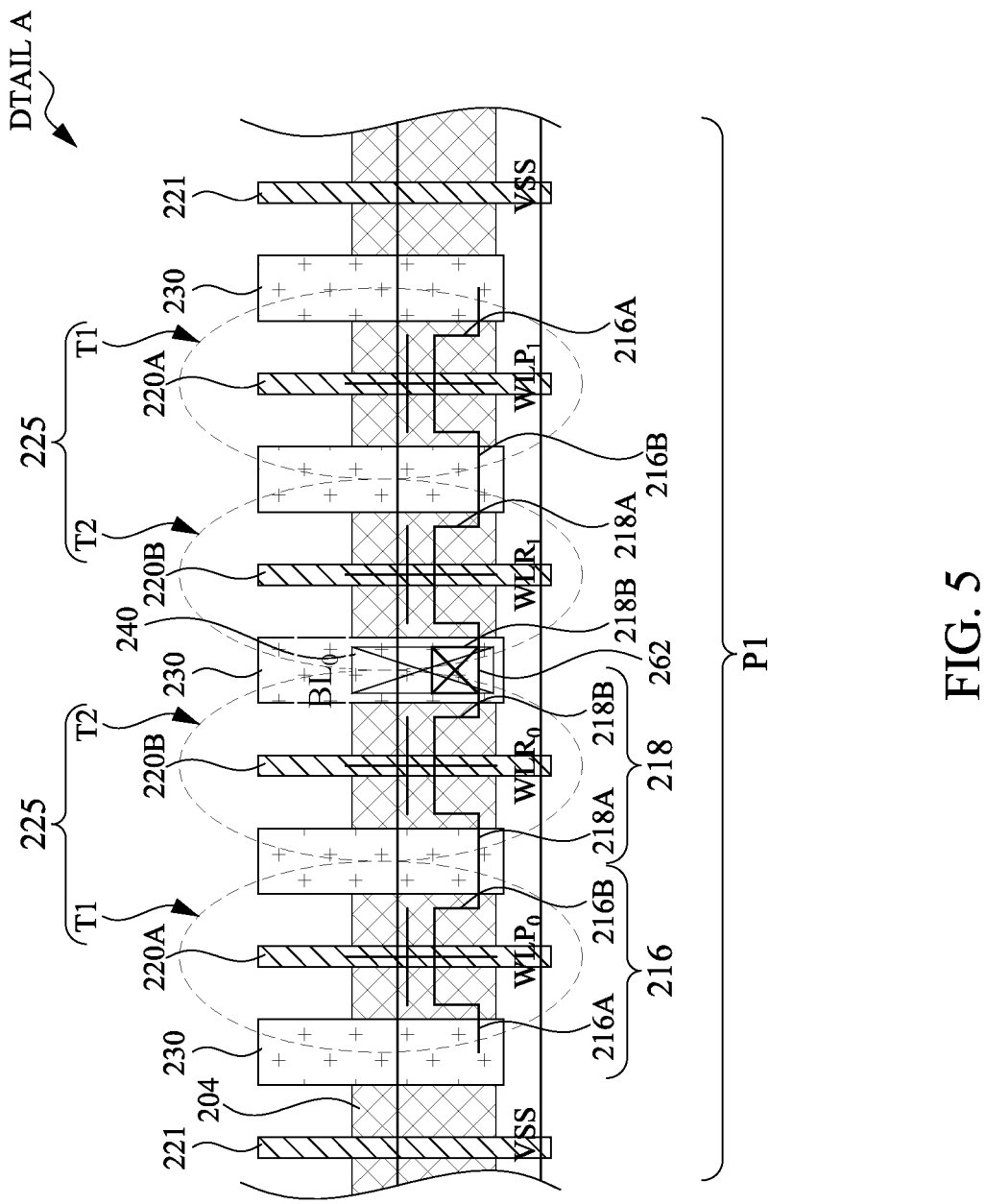

In the present embodiments, referring to FIG. 5, which depicts an enlarged view of DETAIL A of FIG. 4, each gate structure 220A engages with each pair of source/drain regions 216A/216B, collectively referred to as the source/drain regions 216, to form a programming transistor (a first functional transistor, e.g., a FinFET, a GAA FET, etc.) T1, and each gate structure 220B engages with each pair of source/drain regions 218A/218B, collectively referred to as the source/drain regions 218, to form a reading transistor (a second functional transistor e.g., a FinFET, a GAA FET, etc.) T2. Connection and operation of the programming transistor T1 and the reading transistor T2 as applied to an anti-fuse memory cell, such as the anti-fuse memory cell 201A, has been described in detail above. For example, one of the source/drain regions (e.g., the drain region 216A) of the programming transistor T1 is floating, and the other one of the source/drain regions (e.g., the source region 216B) of the programming transistor T1 is coupled in series to one of the source/drain regions (e.g. the drain region 218A) of the reading transistor T2 to form an anti-fuse unit cell (or unit cell) 225. The other one of the source/drain regions (e.g., the source region 218B) is coupled to a power rail, which operatively serves as a BL, disposed in a metallization layer on a backside 202B of the substrate 202 as described in detail below. The unit cell 225 is therefore referred to as a two-transistor (2T) unit cell. In the present embodiments, the source/drain regions 218 of two adjacent unit cells 225 are coupled together at the BL as depicted. Furthermore, although two 2T unit cells 225 are depicted in FIG. 4, the present embodiments are not limited to such a number or configuration of the unit cells 225, so long as one of the source/drain terminals (e.g., the drain terminal) of the reading transistor T2 in a unit cell 225 is coupled to the BL disposed on the backside 202B of the substrate 202.

Still referring to FIG. 4, the anti-fuse memory cell 201A further includes a plurality of source/drain contacts 230 extending lengthwise along the second lateral direction and separated from one another along the first lateral direction, each being interposed between adjacent gate structures 220. Each of the source/drain contacts 230 is coupled to each of the source/drain regions 216/218 of the programming transistors T1 and the reading transistors T2, respectively. In the depicted embodiments, each source/drain contact 230 protrudes from one of the long edges of the active regions 204 towards a horizontal boundary L1 of the first region P1 along the second lateral direction.

Referring to FIGS. 4 and 5, the semiconductor device 200 further includes frontside interconnect structures 300 coupled to the source/drain contacts 230 and the gate structures 220 of the anti-fuse memory cell 201A. The frontside interconnect structures 300 include, for example, vias 260 configured to couple at least some of the source/drain contacts 230 to a frontside metallization layer 310 ($M_0$), which includes metal lines (e.g., metal tracks) 310A, 310B, 310C, and 310D, for example. The anti-fuse memory cell 201A further includes gate contacts 262 configured to couple at least some of the gate structures 220 to the frontside metallization layer 310. The frontside metallization layer 310 may be a first of many metallization layers (e.g., frontside metallization layers 330 and 350) disposed over the frontside 202A of the substrate in the first region P1. Details of the frontside interconnect structures 300 are described below with respect to FIGS. 8-10.

In some embodiments, referring to FIG. 4, the second region P2 is a tap region that electrically couples a particular doped well (e.g., an n-type well for forming a PMOS device or a p-type well for forming an NMOS device) in the substrate 202 to a voltage source (e.g., power/ground). In the depicted embodiments, since the functional transistors are NMOS devices, the second region P2 is a p-type tap (or a P-tap) region configured to electrically couple the p-type well in the anti-fuse memory cell 201A to the power/ground. In some embodiments, the tap region physically and electrically separates adjacent anti-fuse memory devices 201A. In some embodiments, multiple tap regions can be formed to surround the device region, i.e., the first region P1. In some embodiments, the second region P2 is implemented in the anti-fuse memory cell 201A to reduce or prevent undesirable short circuits caused by latchup.

Still referring to FIG. 4, in the second region P2, the semiconductor device 200 includes a plurality of active regions 206 over the frontside 202A of the substrate 202. The active regions 206 are similar to the active regions 204. For example, the active regions 206 each extend lengthwise along the first lateral direction and are separated from one another along the second lateral direction. Two adjacent active regions 206 are separated by a dummy region 205 in the substrate 202, similar to the dummy region 203 between two adjacent active regions 204.

The active regions 206 each have a height H4 defined along the second lateral direction, where the height H4 may be the same as or different from the height H3. In some embodiments, the height H3 is greater than or equal to the height H4. In some embodiments, the height H3 and the height H4 are each about 32 nm, 42 nm, or 58 nm. For example, the height H3 may be about 42 nm and the height H4 may be about 32 nm. A separation distance N between the two adjacent active regions 206 that extends as a height of the dummy region 205 may be the same as or different from the distance M of the dummy region 203. In some examples, the distance (or height) M is at least about 62 nm and the distance (or height) N is at least about 72 nm. As will be discussed in detail below, the formation of a feedthrough via between two adjacent active regions 204 and/or between adjacent active regions 206 is possible when the height M and the height N, respectively, are greater than a height of the feedthrough via defined along the second lateral direction. As depicted herein, the cell height H1 is the sum of the total height of the active regions 204 (e.g., 2*H3), the height M of the dummy region 203, and a total separation distance between each of the active regions 204 and a corresponding horizontal boundary L1 of the first region P1, which can be calculated as a sum of x*M and (1−x)*M, x being a fraction between 0 and 1. In other words, the total separation distance between each of the active regions 204 and a corresponding horizontal boundary L1 equates to the height M. Similarly, the cell height H2 is the sum of the total height of the active regions 206 (e.g., 2*H4), the height N of the dummy region 205, and a total separation distance between each of the active regions 206 and each corresponding horizontal boundary L2 of the second region P2, which can be calculated as a sum of y*N and (1−y)*N, y being a fraction between 0 and 1.

Similar to the region P1, the region P2 of the semiconductor device 200 includes a plurality of gate structures 224 oriented perpendicular to and over portions of each active region 206 to define a channel region interposed between a pair of source/drain regions 226/228 along the first lateral direction. Thus, the gate structure 224 engages with each pair of the source/drain regions 226/228 to form a dummy transistor T3 (e.g., a FinFET, a GAA FET, etc.). The semiconductor device 200 further includes a plurality of source/drain contacts 234 extending along the second lateral direction and interposed between adjacent gate structures 224. Each of the source/drain contacts 234 is electrically coupled to each of the source/drain regions 226/228 of the dummy transistor T3. In the depicted top view, each source/drain contact 234 protrudes from one of the long edges of the active regions 204 towards the horizontal boundary L2 of the second region P2 along the second lateral direction.

In the present embodiments, the source/drain terminals (i.e., both of the source/drain regions 226/228) and the gate terminal interposed between the source/drain terminals of each dummy transistor T3 are coupled to the BL disposed on the backside 202B of the substrate 202 as a portion of backside interconnect structures 250. As such, the dummy transistors T3 do no participate in the operation of the anti-fuse memory cell 201A. In some embodiments, referring to FIG. 4, the backside interconnect structures 250 include a backside metallization layer (BM$_0$) 252, which further includes multiple metal lines (or metal tracks) 252A, 252B, and 252C, for example. In the present embodiments, the plurality of dummy transistors T3 are coupled together in parallel.

Similar to the first region P1, portions of the dummy transistors T3 in the second region P2 are coupled to the frontside interconnect structures 300. For example, the vias 260 are configured to couple each of the source/drain contacts 234 to the frontside metallization layer 310, and the gate contacts 262 are configured to couple each of the gate structures 224 to the frontside metallization layer 310.

Figure 6:
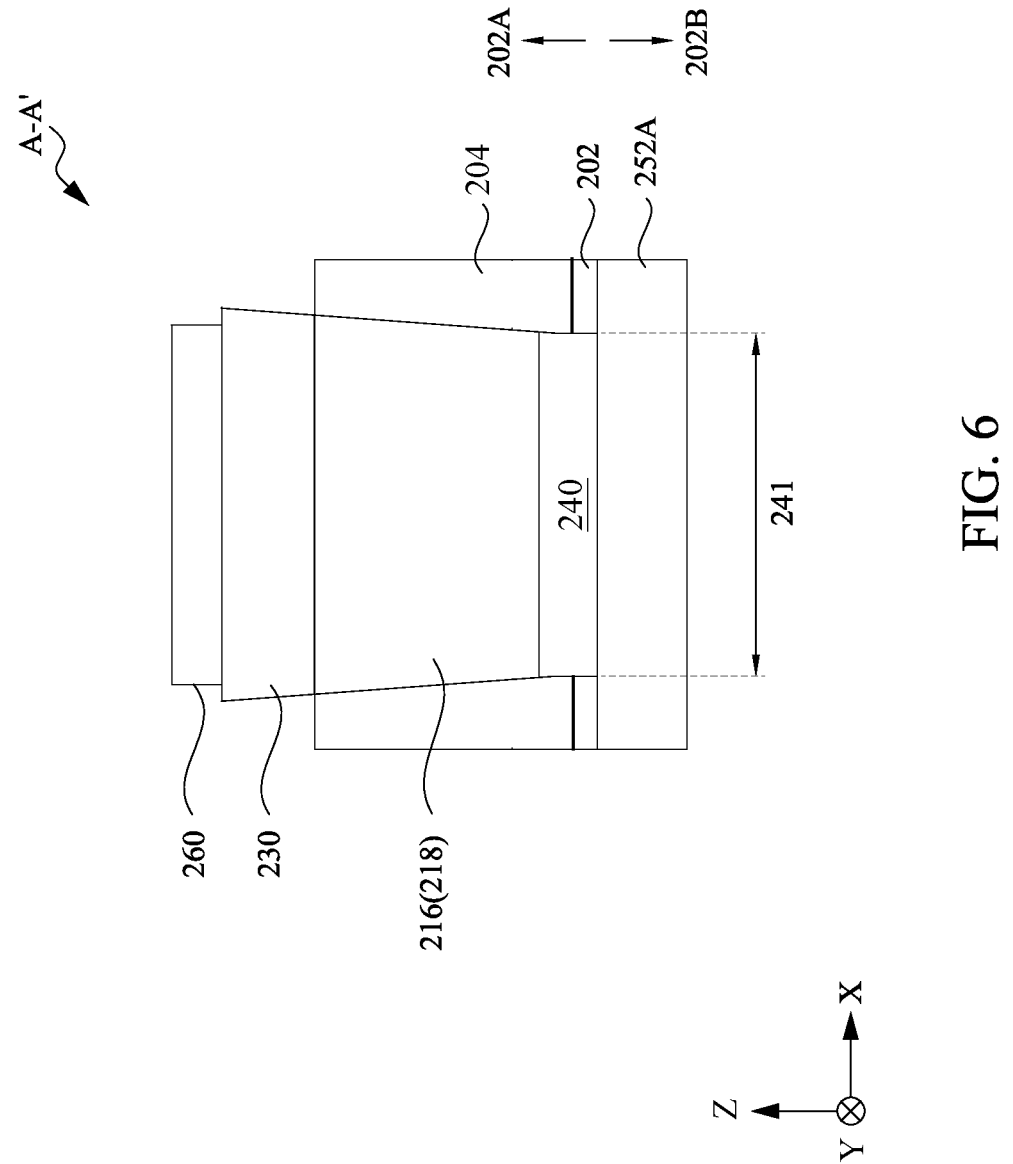
FIG. 6 illustrates a schematic cross-sectional view along line AA' of the example memory cell of FIG. 4, in accordance with some embodiments.

Referring to FIG. 6, which illustrates a cross-sectional view of the anti-fuse memory cell 201A along line AA' of FIG. 4, the semiconductor device 200 includes a backside via 240 coupled to a portion of the anti-fuse memory cell 201A in the first region P1. The backside via 240 extends vertically (e.g., along the Z axis) through at least the substrate 202 and the active region 204 to couple the metal line 252A of the backside metallization layer (BM$_0$) 252 to the source/drain region 218 (218B) of the reading transistors T2 in adjacent unit cells 225, as depicted in FIG. 5. The metal line 252A is considered a part of backside interconnect structures 250 (e.g., an implementation of the BL$_0$ in FIGS. 2 and 3, for example) coupled to the frontside components (e.g., programming transistor T1 and the reading transistor T2) of the anti-fuse memory cell 201A through the backside via 240. In the present embodiments, the backside via 240 directly contacts both the metal line 252A and the source/drain region 218. In this regard, the backside via 240 partially penetrates the active region 204 in the vertical direction (e.g., along the Z axis). As discussed above, the backside interconnect structures 250 are configured to provide a voltage from the backside 202B to the source/drain region 218 on the frontside 202A of the substrate 202 to establish the conduction (e.g., programming) path for the anti-fuse memory cell 201A.

The backside via 240 has a width 241 defined along the first lateral direction. Though not depicted, the backside via 240 may include a metal fill layer (not depicted separately) over a barrier layer (not depicted separately). The metal fill layer may include any suitable conductive material including, for example, tungsten (W), copper (Cu), aluminum (Al), gold (Au), cobalt (Co), ruthenium (Ru), the like, or combinations thereof. In some examples, the metal fill layer may include a seed layer. The barrier layer may include T1, Ta, TiN, TaN, the like, or combinations thereof. In some embodiments, though not depicted, the anti-fuse memory cell 201A further includes a first metal silicide layer disposed between the backside via 240 and the source/drain region 218 and a second metal silicide layer disposed between a frontside (or top surface) of the source/drain region 216/218 and the source/drain contact 230.

Figure 7:
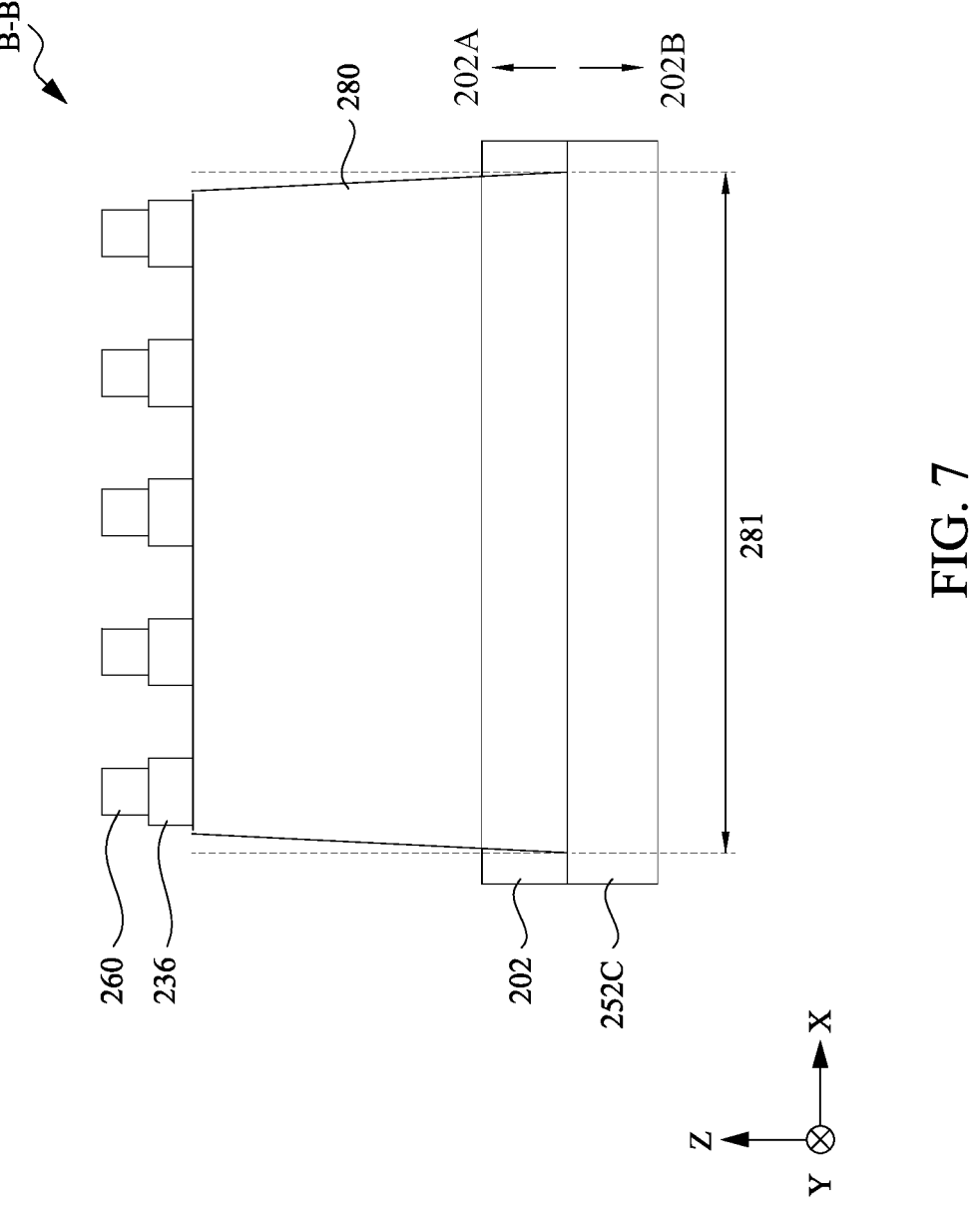
FIG. 7 illustrates a schematic cross-sectional view along line BB' of the example memory cell of FIG. 4, in accordance with some embodiments.

FIG. 7 illustrates a feedthrough via 280 in a cross-sectional view of the anti-fuse memory cell 201A along line BB' in the second region P2 of FIG. 4. As shown in the layout design of FIG. 4, the feedthrough via 280 extends lengthwise along the first lateral direction and is separated from adjacent active regions 206 along the second lateral direction in a top view. Specifically, the feedthrough via 280 is disposed between two adjacent active regions 206. The feedthrough via 280 extends through at least the substrate 202 to couple a metal line 252C, which is similar to the metal line 252A, to a contact feature 236 on the frontside 202A, and subsequently to the frontside interconnect structures 300, of the anti-fuse memory cell 201A. Different from the backside via 240, the feedthrough via 280 directly couples the metal line 252C to the contact feature 236, and is thus not coupled to any portion of the dummy transistor T3. The feedthrough via 280 may include a metal fill layer (not depicted separately) over a barrier layer (not depicted separately), similar to the backside via 240.

The feedthrough via 280 has a width 281 defined along the first lateral direction, where the width 281 is greater than the width 241 of the backside via 240 as depicted in FIG. 4. As such, a cross-sectional area of the feedthrough via 280 in the X-Y plane is greater than a cross-sectional area of the backside via 240, leading to a lower resistance than the backside via 240. Compositions of the metal fill layer and the barrier layer may be similar to those of the metal fill layer and the barrier layer of the backside via 240, respectively, as discussed above.

Figure 8:
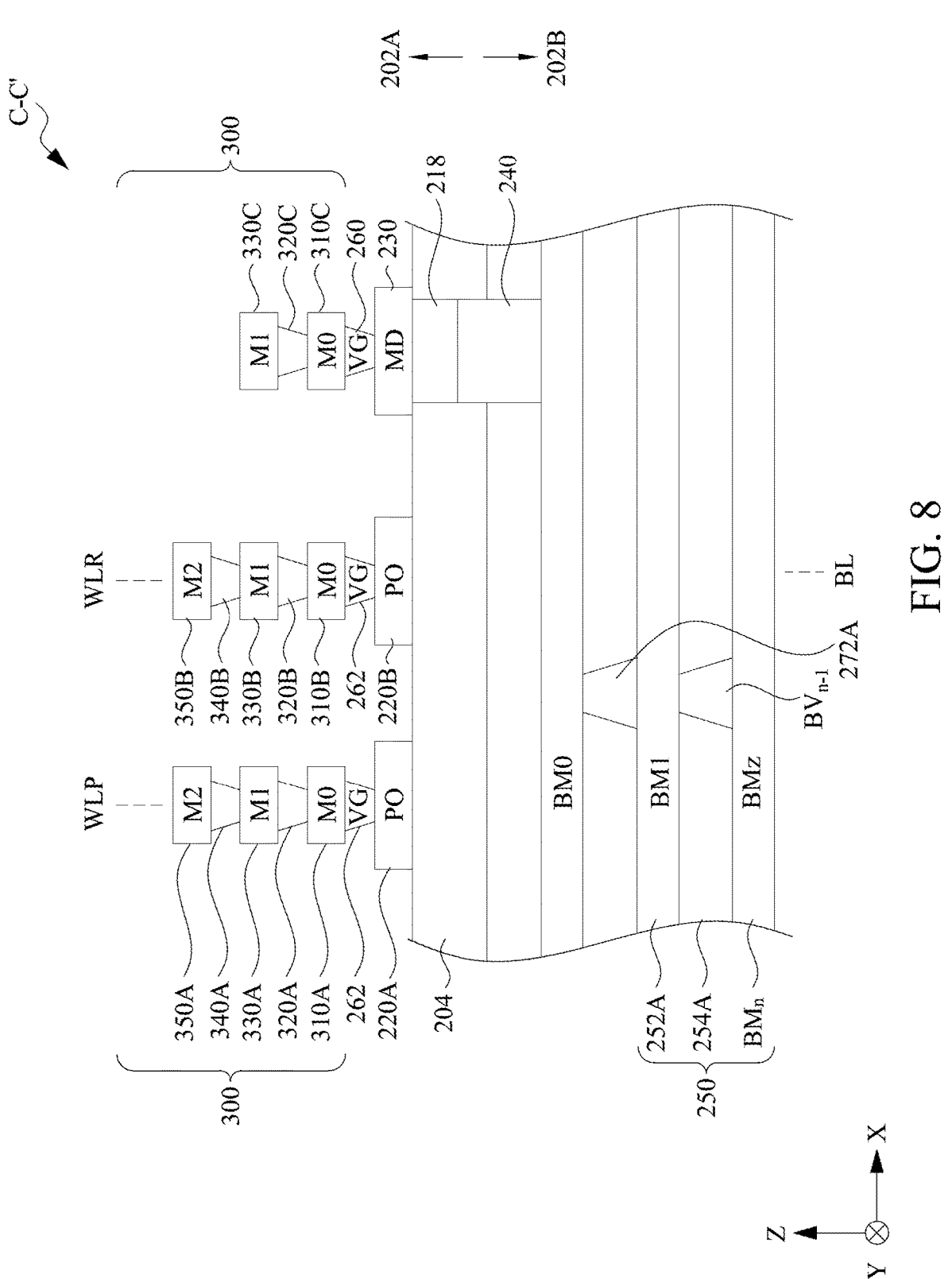

FIG. 8 illustrates a cross-sectional view of a portion of the semiconductor device 200 in the first region P1 along line CC' of FIG. 4, which is through the two adjacent unit cells 225 as depicted in FIG. 5. The backside via 240 couples the backside metallization layer (BM$_0$) 252 (e.g., the metal line 252A) to the source/drain region 218 of the reading transistor T2 in each of the unit cells 225, establishing a connection that delivers the voltage applied at the BL from the backside 202B to the anti-fuse memory cell 201A on the frontside 202A.

Figure 9:
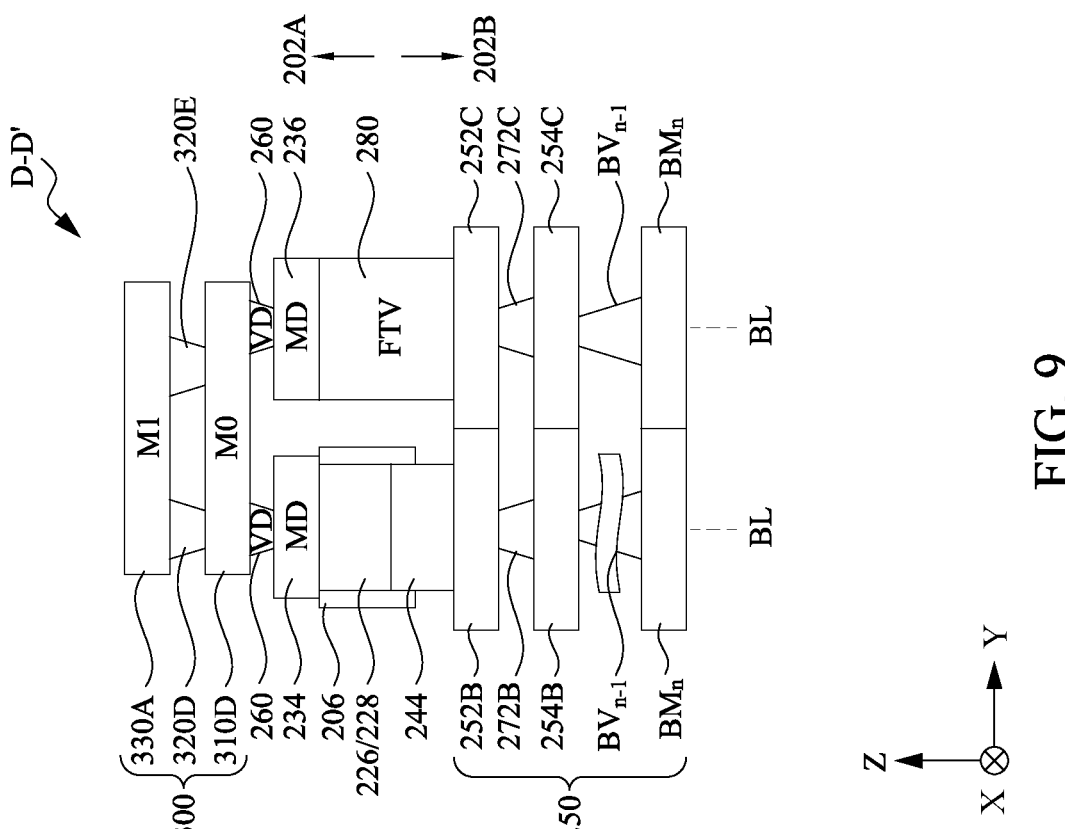
FIGS. 9, 13, 18, 22, and 26 each illustrate a schematic cross-sectional view along line DD' of the example memory cell of FIGS. 4, 11, 16, and 24, respectively, in accordance with some embodiments.

FIG. 9 illustrates a cross-sectional view of a portion of the semiconductor device 200 in the second region P2 along line DD' of FIG. 4. While FIG. 8 depicts a cross-sectional view of the anti-fuse memory cell 201A along the first lateral direction, FIG. 9 illustrates a portion of the second region P2 across both the active region 206 and the adjacent dummy region 205 along the second lateral direction. The semiconductor device 200 in the second region P2 includes a backside via 244 (also depicted in FIG. 4) that extends vertically (e.g., along the Z axis) through a portion of the substrate 202 and the active region 206 to couple the metal line 252B to one of the source/drain regions 226/228 of the dummy transistor T3, where the metal line 252B (also depicted in FIG. 4) is formed as a part of the backside interconnect structures 250 described above. The backside via 244 extends lengthwise along the second lateral direction as depicted in the layout design of FIG. 4. Through the dummy transistor T3 in the second region P2, the backside via 244 couples the backside interconnect structures 250 to the frontside interconnect structures 300 and subsequently to the functional transistors (e.g., the programming transistors T1 and the reading transistors T2) of the anti-fuse memory cell 201A in the first region P1, establishing a conduction path between the functional transistors, the dummy transistor T3, and the backside interconnect structures 250, from where the voltage is applied. In some embodiments, the backside via 244 is similar in structure and dimension to the backside via 240 of the anti-fuse memory cell 201A. In some embodiments, the backside vias 240 and 244 have the same structure and dimension. For example, the backside vias 240 and 244 both have the width 241 as described above. In the present embodiments, the backside vias 240, 244, and the feedthrough via 280 are coupled in parallel between the frontside interconnect structures 300 and the backside interconnect structures 250.

In addition, still referring to FIG. 9, the semiconductor device 200 in the second region P2 includes the feedthrough via 280 that extends vertically through the dummy region 205 (i.e., the substrate 202) to couple the backside metallization layer 252 (e.g., the metal line 252C) to the contact feature 236, which is further coupled to the frontside interconnect structures 300. This is in contrast to the backside via 244, which couples the metal line 252B to one of the source/drain regions 226/228 of the dummy transistor T3. In the depicted embodiments, the metal lines 252B and 252C are separated from one another along the second lateral direction, as depicted in FIG. 4. Through the contact feature 236, the feedthrough via 280 couples the backside interconnect structures 250 to the frontside interconnect structures 300 and subsequently to the functional transistors, establishing a conduction path between the functional transistors T1 and T2, the dummy transistors T3, and the backside interconnect structures 250, from where the voltage is applied. As feedthrough vias generally exhibit a lower resistance than backside vias as described above due to larger cross-sectional areas (e.g., the width 281 is greater than the width 241), by incorporating the feedthrough via 280 in the second region P2, the resistance of the conduction path can be further reduced.

In some embodiments, the feedthrough via 280 has a height H5 extending along the second lateral direction. In this regard, the placement of the feedthrough via 280 between the active regions 206 indicates that the height N of the dummy region 205 is configured to exceed the height H5 of the feedthrough via 280. In some embodiments, the height H5 is about 70 nm and the height N is at least about 72 nm. In some embodiments, the height H5 is determined based on the height N or the height H4 of the active region 206, given a constant cell height H2 of the second region P2. In the depicted embodiments, because the height M of the dummy region 203 in the anti-fuse memory cell 201A is less than the height H5 (due to pre-determined dimension of the first region P1 according to applicable design rules, for example), the first region P1 does not include any feedthrough vias.

Figure 10:
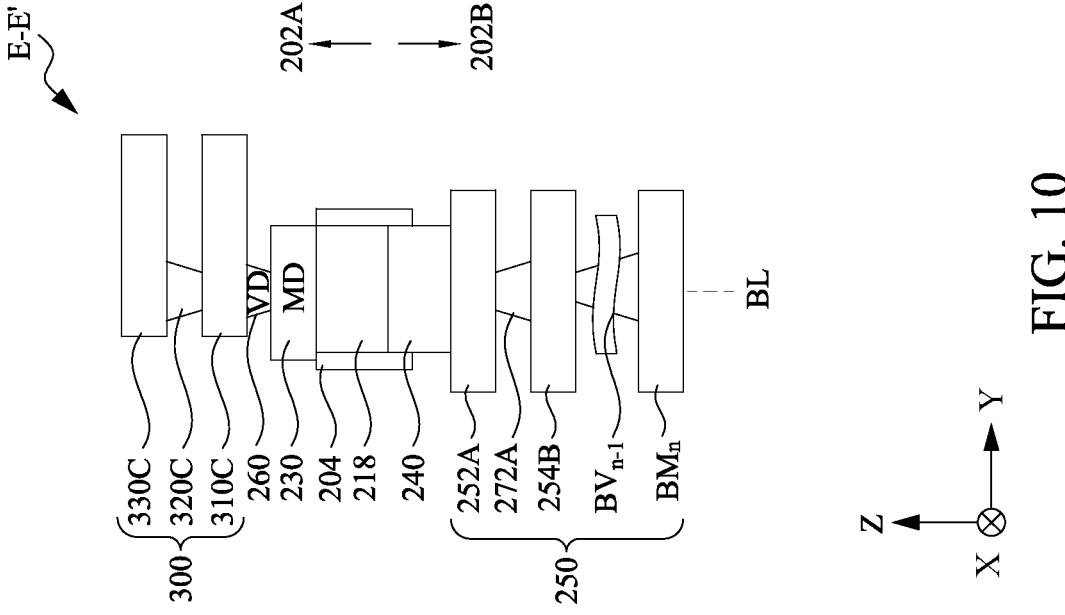
FIGS. 10, 14, 19, 23, and 27 each illustrate a schematic cross-sectional view along line EE' of the example memory cell of FIGS. 4, 11, 16, and 24, respectively, in accordance with some embodiments.

FIG. 10 illustrates a cross-sectional view of a portion of the semiconductor device 200 in the first region P1 along line EE' of FIG. 4, where the line EE' is taken though the source/drain region 218 of the reading transistor T2 in the unit cell 228 along the second lateral direction. In this regard, FIG. 10 illustrates a portion of the first region P1 across both the active region 204 and the adjacent dummy region 203, where the source/drain region 218 is coupled to the metal line 252A in the backside interconnect structures 250 through the backside via 240.

Referring to FIGS. 8-10 collectively, additional details of the frontside interconnect structures 300 and the backside interconnect structures 250 are also illustrated. For example, the frontside interconnect structures 300 further include a frontside metallization layer 330 disposed above and interconnected to the frontside metallization layer 310 by vias 320A, 320B, 320C, 320D, and 320E, collectively referred to as via 320 ($V_0$). Additional frontside metallization layers over the frontside metallization layer 310 ($M_0$) may be designated as $M_1$, $M_2$, . . . , and $M_n$, where adjacent frontside metallization layers are interconnected by vias $V_1$, $V_2$, . . . $V_{n-1}$, respectively. Each of the frontside metallization layer includes one or more metal lines that is electrically coupled to a corresponding via. In the depicted embodiment, the frontside metallization layers $M_1$ and $M_2$ correspond to frontside metallization layers 330 (including metal lines 330A, 330B, 330C, and 330D) and 350 (including metal lines 350A and 350B), respectively, and the via $V_1$ corresponds to vias 340 (including vias 340A and 340B).

Similarly, the backside interconnect structures 250 include a plurality of backside metallization layers, such as $BM_0$, $BM_1$, . . . and $BM_n$, coupled together by vias, such as $BV_0$, $BV_1$, . . . $BV_{n-1}$. For example, the backside metallization layer 252 ($BM_0$), which includes metal lines 252A, 252B, and 252C, is interconnected to a backside metallization layer 254 ($BM_1$), which includes metal lines 254A, 254B, and 254C, by one or more of vias 272A, 272B, 272C, and 272D, which are collectively referred to as via 272 ($BV_0$).

It is noted that, for purposes of simplicity and clarity, various dielectric (e.g., insulating) layers within which the frontside and backside metallization layers (including the interconnect structures) are formed are omitted from the depiction of various embodiments of the anti-fuse memory cells in the present disclosure. These dielectric layers may include, for example, etch-stop layers (ESLs), interlayer dielectric (ILD) layers, and intermetal dielectric (IMD) layers, to name a few. In addition, the substrate 202 extending below the active regions 204 and 206 and the dummy regions 203 and 205 is also omitted in the cross-sectional views of various anti-fuse memory cells depicted in FIGS. 8-10, 12-14, 17-19, 21-23, and 25-27.

In some embodiments, referring to FIGS. 11-14, the semiconductor device 200 includes a plurality of anti-fuse memory cells 201B. In some embodiments, the anti-fuse memory cell 201B is similar to the anti-fuse memory cell 201A in some aspects. For example, cross-sectional views of the anti-fuse memory cell 201B along the line CC' and the line DD' depicted in FIGS. 12 and 13, respectively, are similar to those of the anti-fuse memory cell 201A depicted in FIGS. 8 and 9, respectively.

Figure 11:
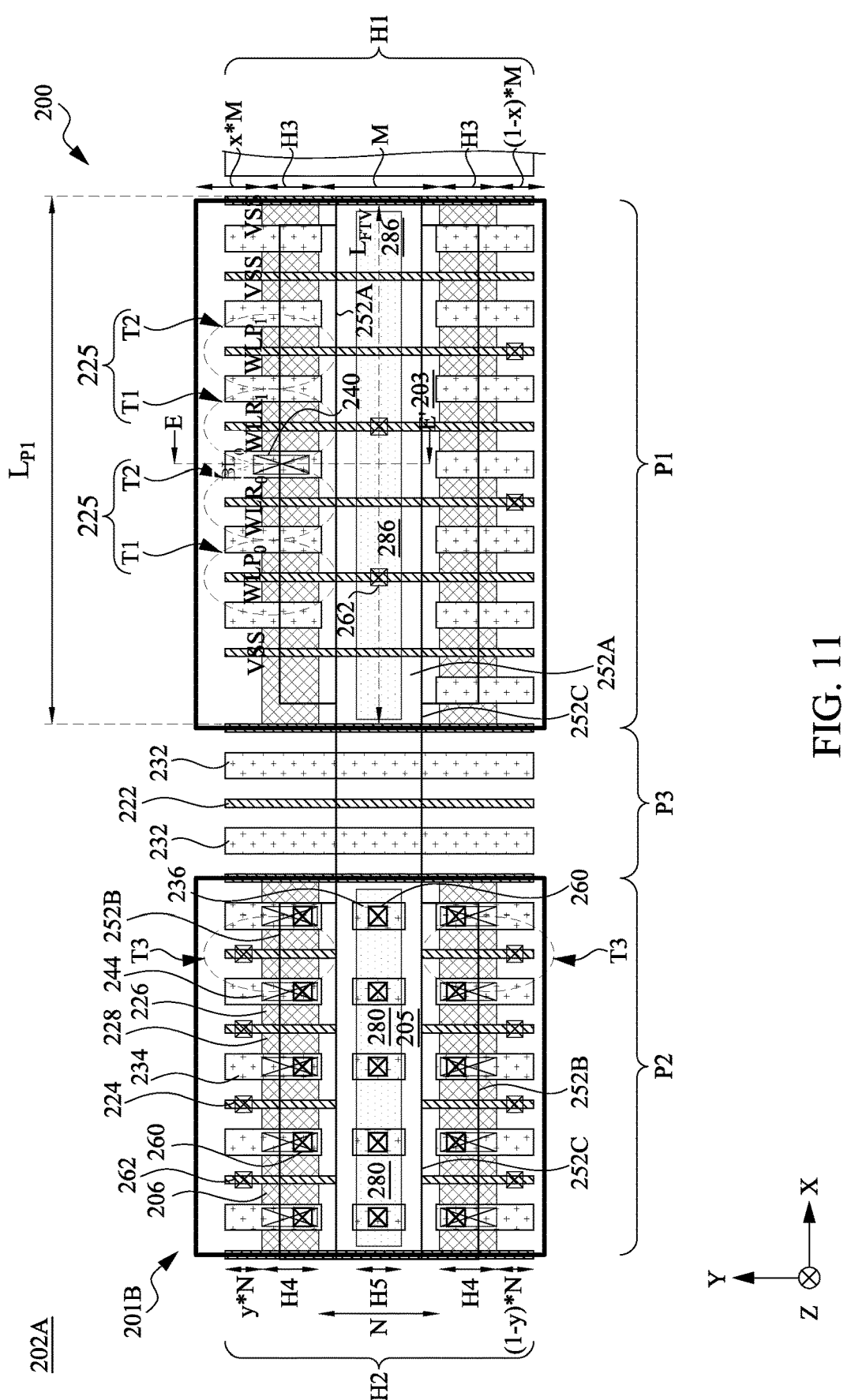
Figure 12:
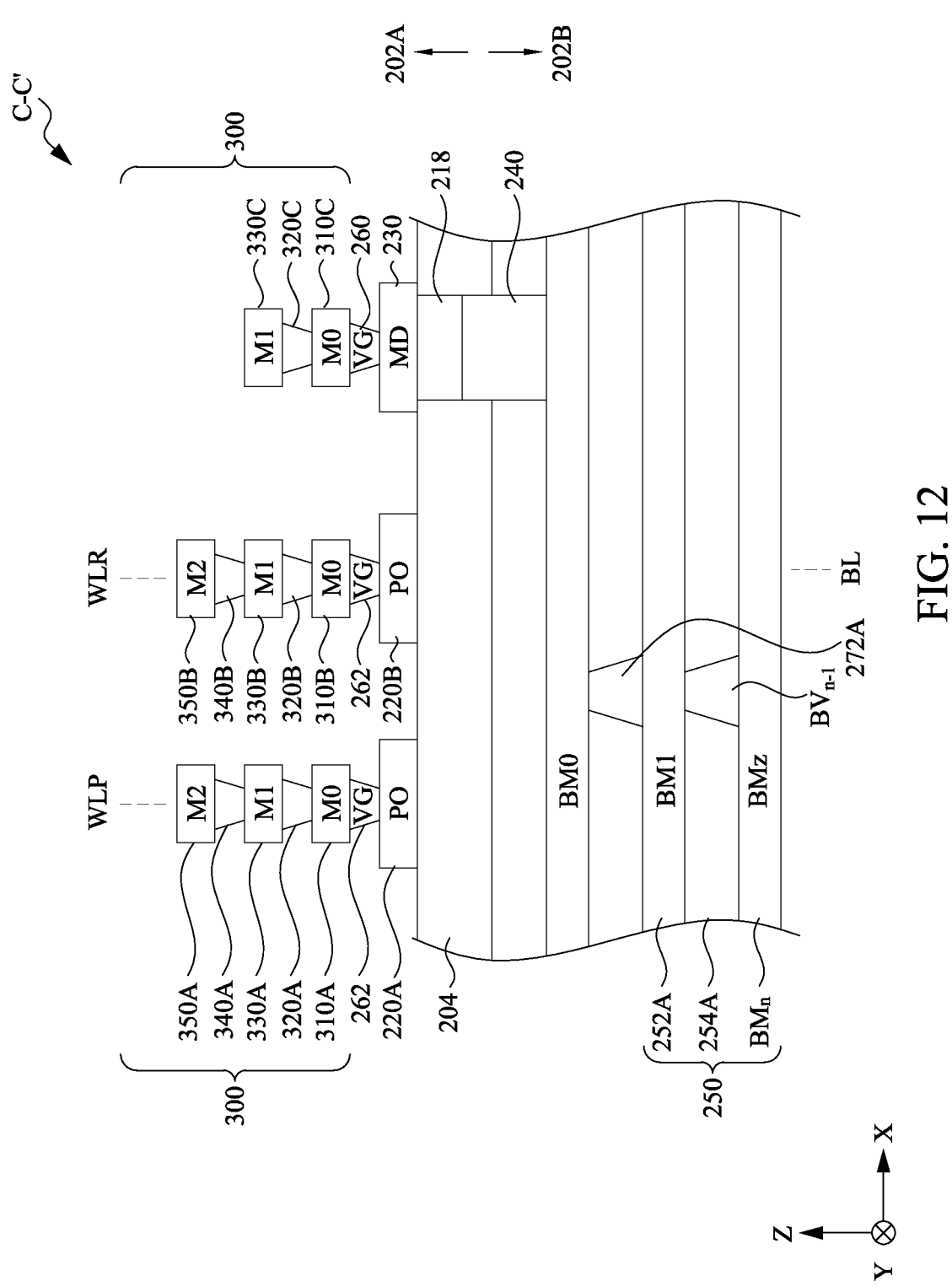
Figures 13, 14:
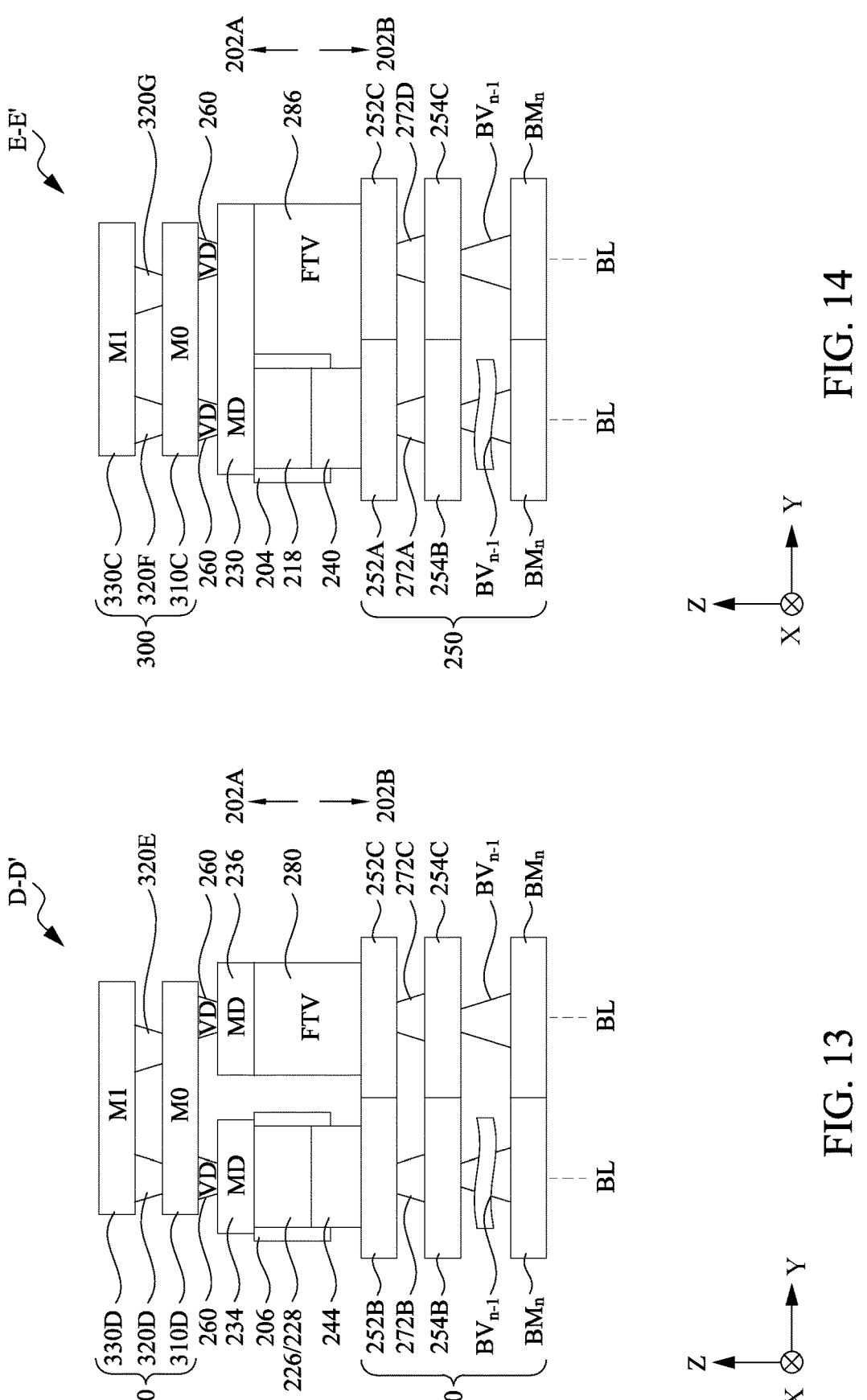

However, different from the anti-fuse memory cell 201A depicted in top view of FIG. 4 and the corresponding cross-sectional views, the dummy region 203 of the anti-fuse memory cell 201B includes a feedthrough via 286. Referring to FIGS. 11 and 14, which depict a frontside layout design and a cross-sectional view along line EE' of FIG. 11, respectively, the dummy region 203 in the first region P1 is configured to have the height M that exceeds the height H5 of the feedthrough via 286. In this regard, for a given cell height H1, which is substantially the same as the cell height H2 in the depicted embodiment, the height H3 of the active regions 204 is reduced to enlarge an area of the dummy region 203, allowing the layout of the first region P1 to accommodate the placement of the feedthrough via 286. In some embodiments, the reduced height H3 is similar to or the same as the height H4 of the active regions 206 in the second region P2. In some embodiments, the reduced height H3 is greater than the height H4 of the active regions 206. In some embodiments, instead of reducing the height H3, the active regions 204 are further spaced apart along the second lateral direction to enlarge the height M of the dummy region 203. In some embodiments, the feedthrough via 286 has a width $L_{FTV}$ along the first lateral direction. As depicted, the width $L_{FTV}$ extends an entire width $L_{P1}$ of the first region P1.

In some embodiments, the feedthrough vias 280 and 286 have the same structure and dimension. For example, the feedthrough vias 280 and 286 have the same height H5 and the width 281 as described above. Furthermore, comparing FIG. 13 to FIG. 14, the feedthrough via 286 couples the backside interconnect structures 250 (e.g., the metal line 252C) to the source/drain contact 230, which are further coupled to the frontside interconnect structures 300 (e.g., to the metal line 330C though vias 320F and 320G, for example), while the feedthrough via 280 couples the backside interconnect structures 250 (e.g., the metal line 252C) to the contact feature 236. The incorporation of the feedthrough via 286 in the first region P1 further reduces the resistance of the conduction path between the functional transistors T1 and T2, the dummy transistor T3, and the backside interconnect structures 250, which operatively serve as the BL of the anti-fuse memory cell 201A.

Figure 15:
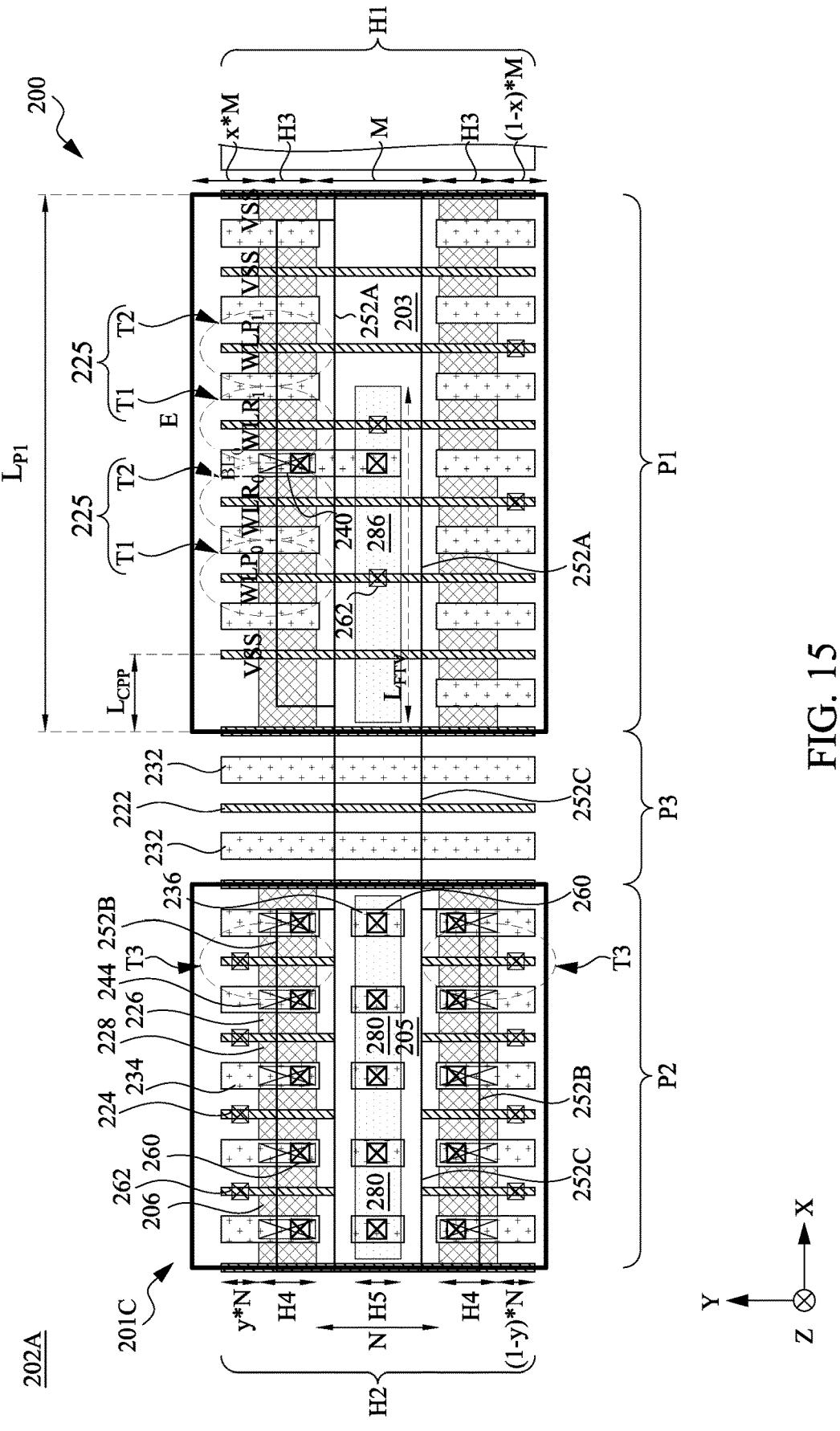

In some embodiments, referring to FIG. 15, the semiconductor device 200 includes a plurality of anti-fuse memory cells 201C. In some embodiments, the anti-fuse memory cell 201C is similar to the anti-fuse memory cell 201B in some aspects. For example, in the top view of FIG. 15, the source/drain region 218 of each reading transistor T2 is coupled to the backside interconnect structures 250 through the backside vias 240 in the first region P1, the frontside interconnect structures 300 are coupled to the backside interconnect structures 250 in the first region P1 (i.e., the dummy region 203) through the feedthrough via 286, the source/drain regions 226/228 of the dummy transistors T3 are coupled to the backside interconnect structures 250 through the backside vias 244 in the second region P2, and the frontside interconnect structures 300 are coupled to the backside interconnect structures 250 in the second region P2 (i.e., the dummy region 205) through the feedthrough via 280.

However, different from the anti-fuse memory cell 201B, the length $L_{FTV}$ of the feedthrough via 286 disposed in the dummy region 203 of the anti-fuse memory cell 201C is less than that of the feedthrough via 286 disposed in the dummy region 203 of the anti-fuse memory cell 201B. In some embodiments, the $L_{FTV}$ ranges from about 1 nm to about 500 µm. In some embodiments, the $L_{FTV}$ extends a distance that ranges from a width $L_{CPP}$ to the width $L_{P1}$, where the width $L_{CPP}$ is equivalent to one gate pitch (i.e., a separation distance between two adjacent gate structures 220) and the width $L_{P1}$ is equivalent to the entire width of the first region P1 along the first lateral direction.

Figure 16:
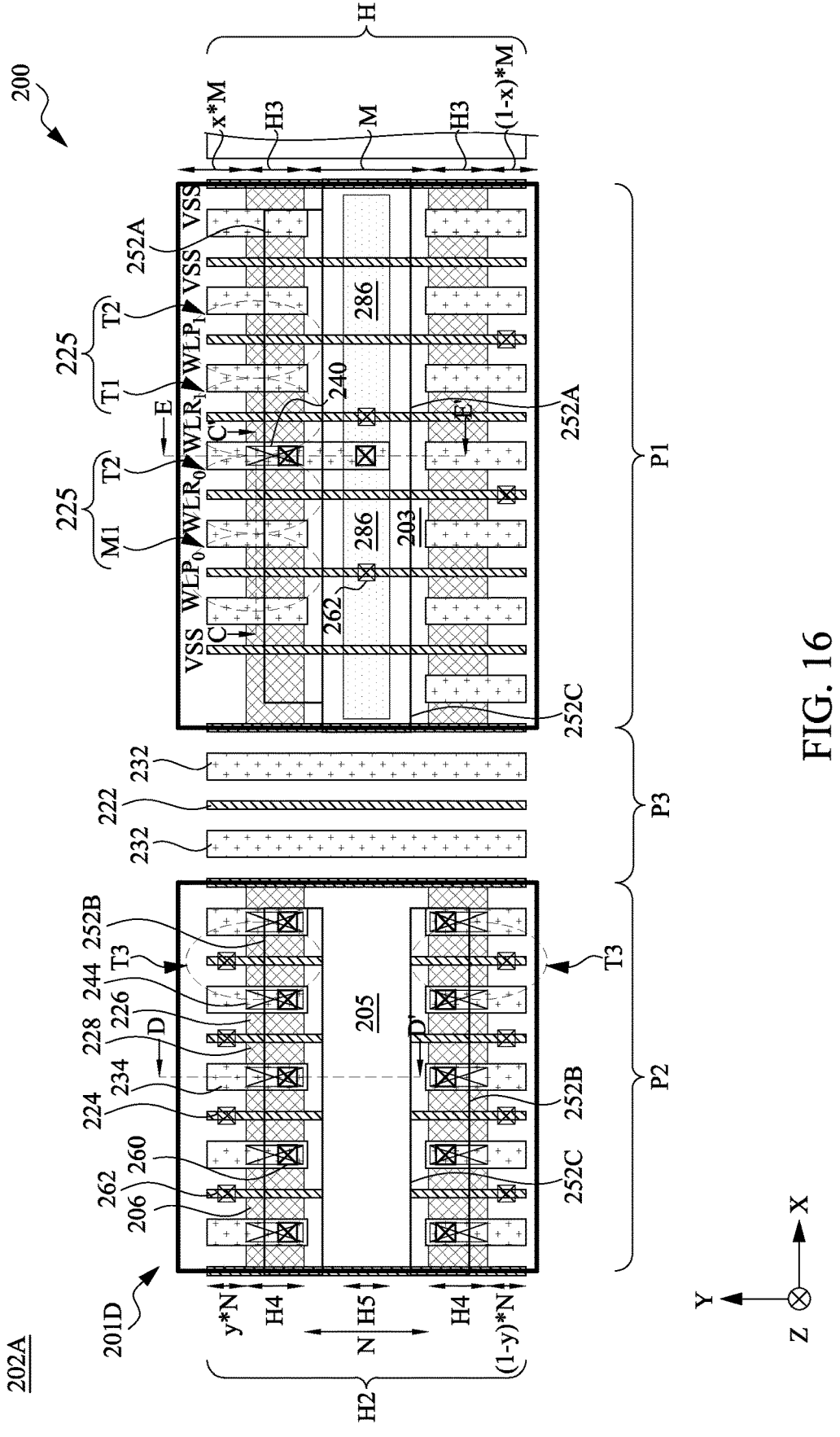
Figure 17:
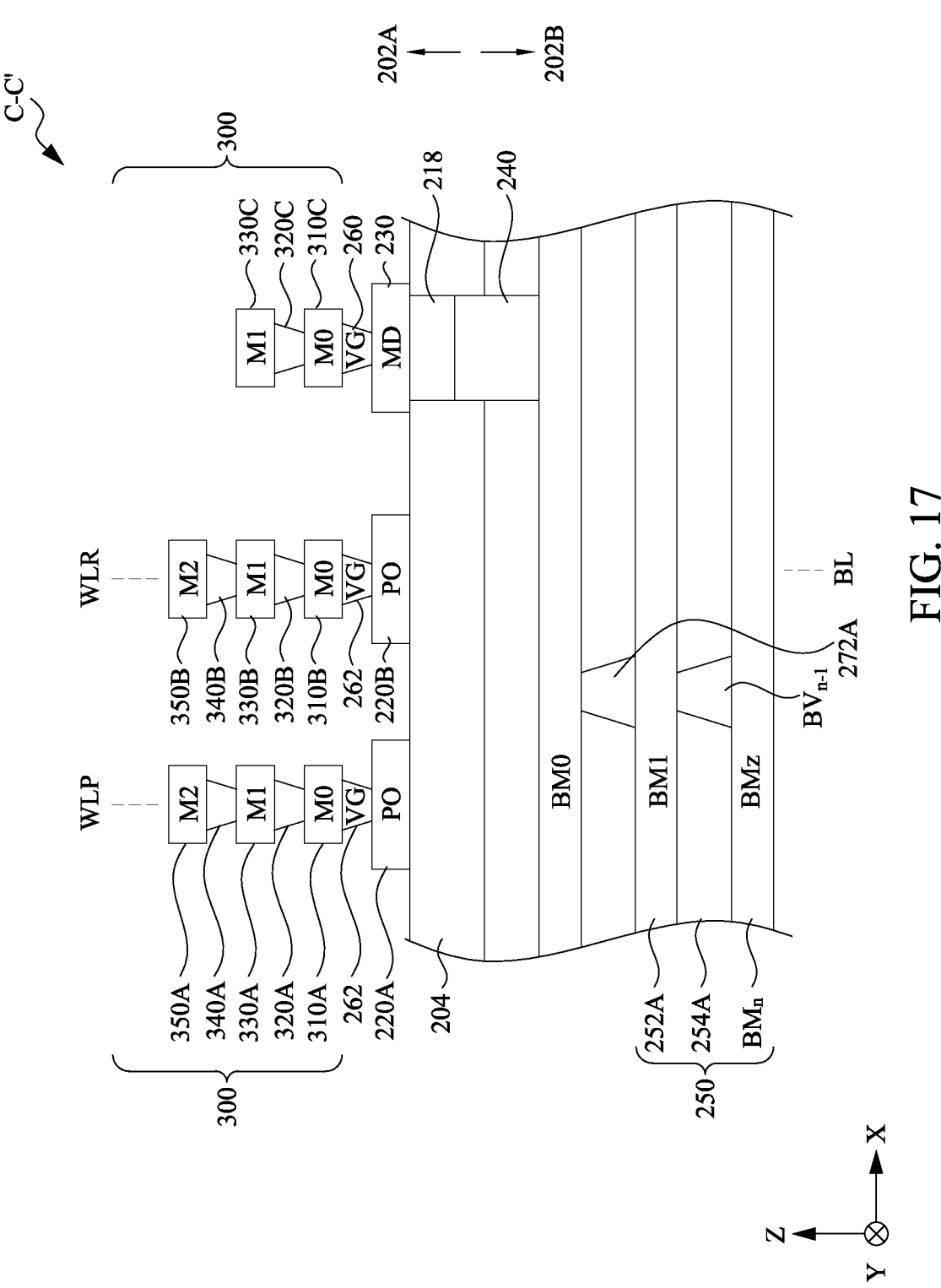
Figure 19:
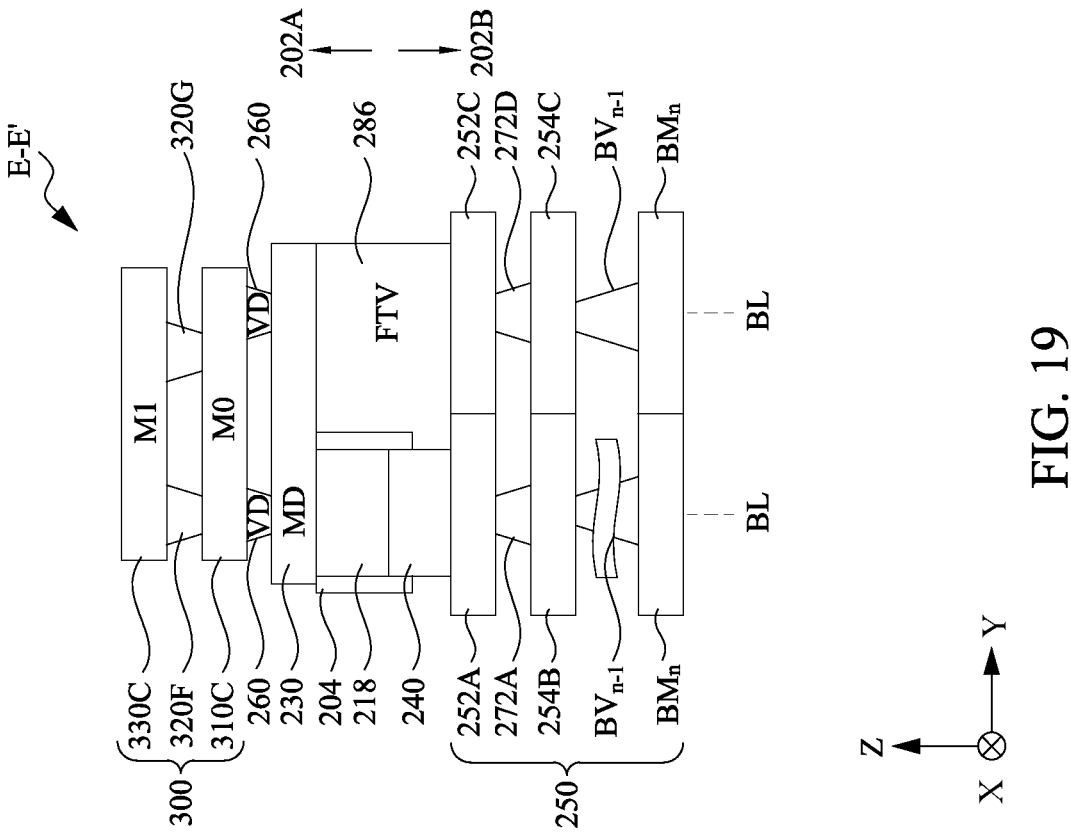
Figure 18:
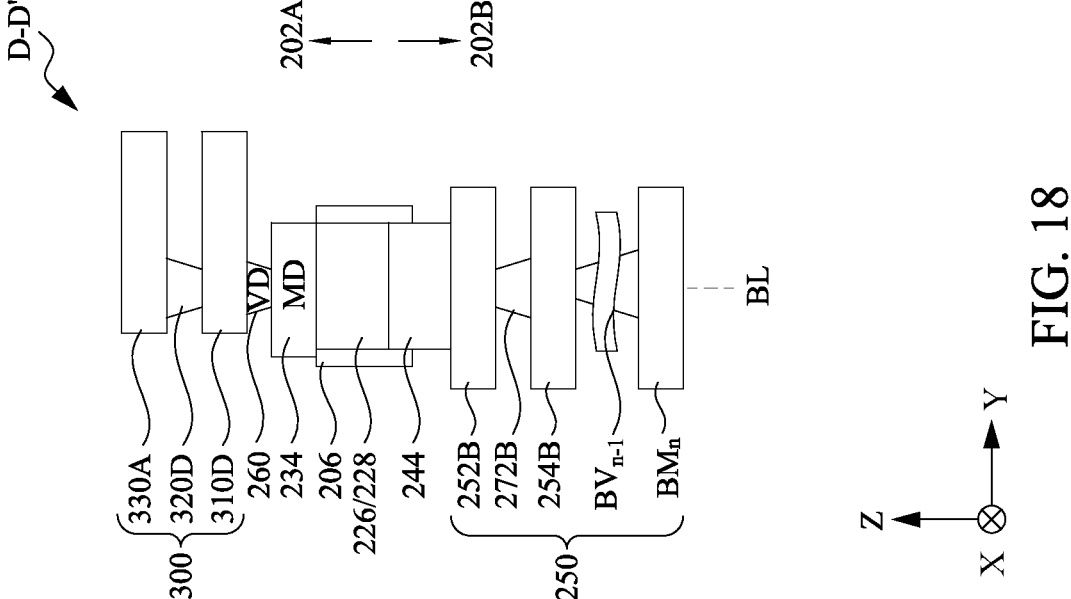

In some embodiments, referring to FIGS. 16-19, the semiconductor device 200 includes a plurality of anti-fuse memory cells 201D, where FIG. 16 depicts a frontside layout design of the anti-fuse memory cell 201D and FIG. 18 depicts a cross-sectional view of the anti-fuse memory cell 201D along the line DD' of FIG. 16. In some embodiments, the anti-fuse memory cell 201D is similar to the anti-fuse memory cell 201B in some aspects. For example, cross-sectional views of the anti-fuse memory cell 201D along the line CC' and the line EE' depicted in FIGS. 17 and 19, respectively, are similar to those of the anti-fuse memory cell 201B depicted in FIGS. 12 and 14, respectively. In this regard, the dummy region 203 in the first region P1 of the anti-fuse memory cell 201D is configured to have the height M that exceeds the height H5 of the feedthrough via 286, and the height H3 of the active regions 204 does not exceed the height H4 of the active regions 206.

However, different from the anti-fuse memory cell 201B depicted in FIGS. 11-14 and referring to FIGS. 16 and 18, the dummy region 205 of the anti-fuse memory cell 201D does not include any feedthrough via 280. Accordingly, the resistance of the conduction path between the functional transistors T1 and T2, the dummy transistor T3, and the backside interconnect structures 250 in the anti-fuse memory cell 201D may be similar to that of the anti-fuse memory cell 201A but greater than that of the anti-fuse memory cell 201B.

Figure 20:
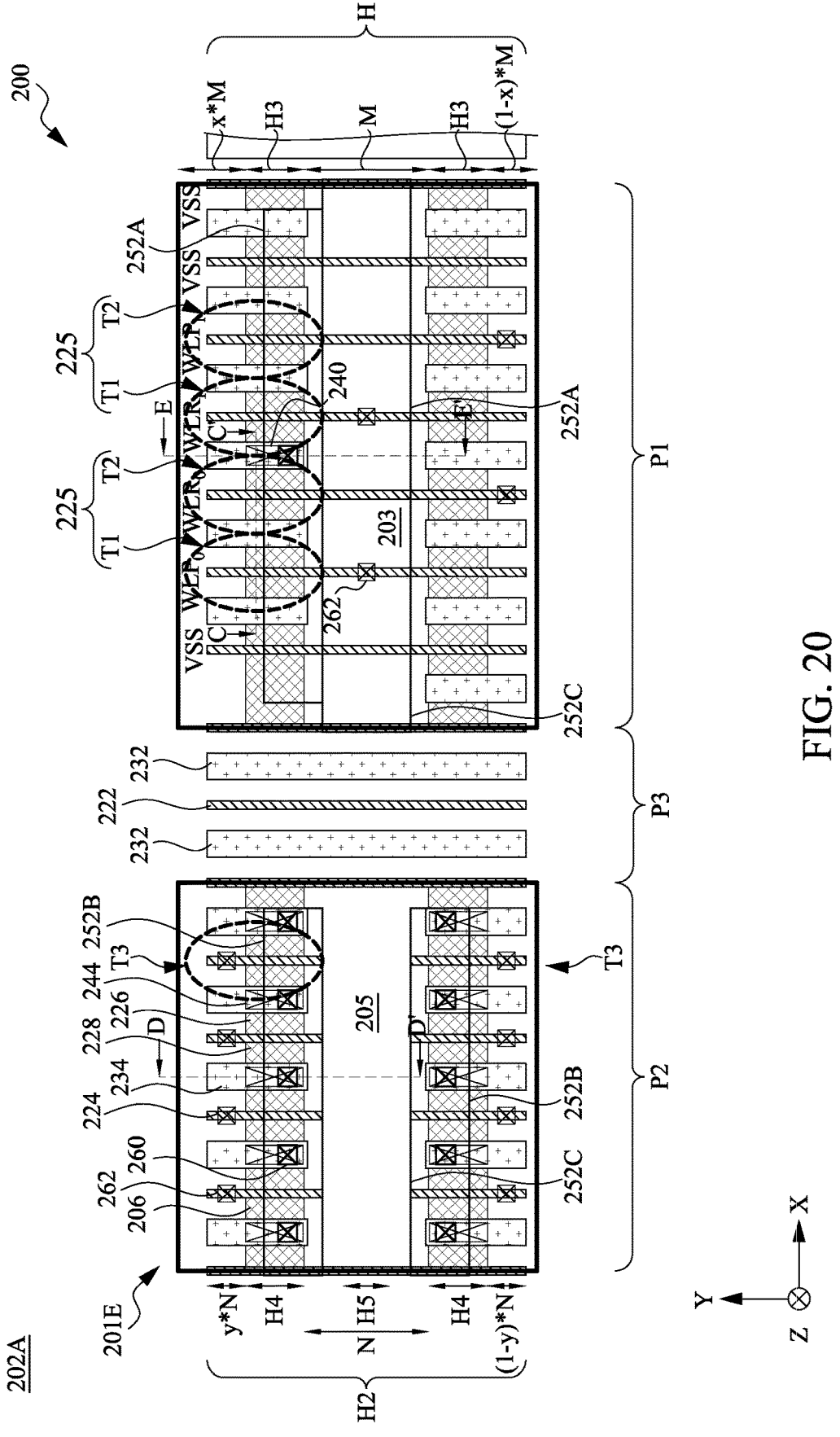
Figure 21:
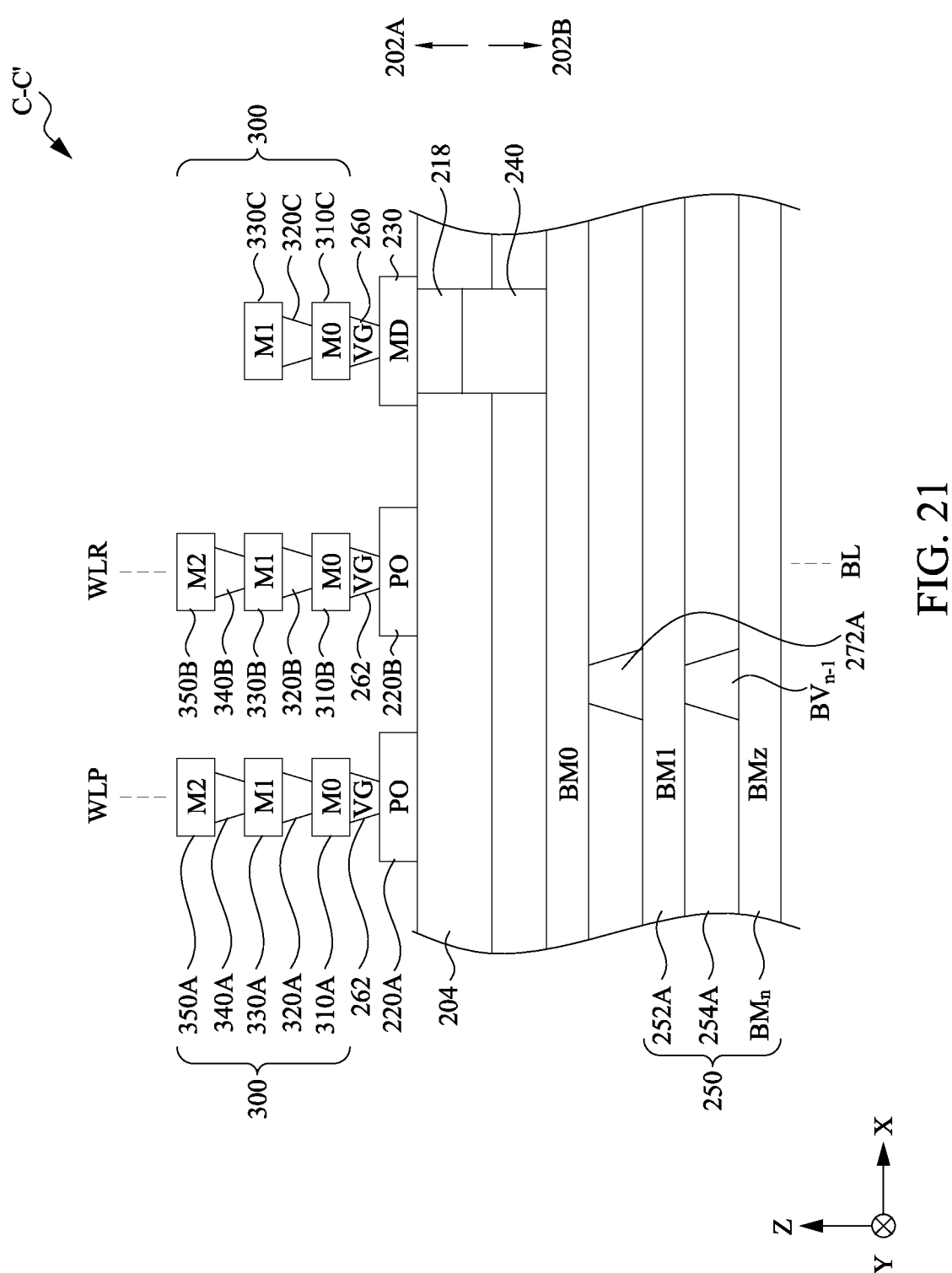
Figure 23:
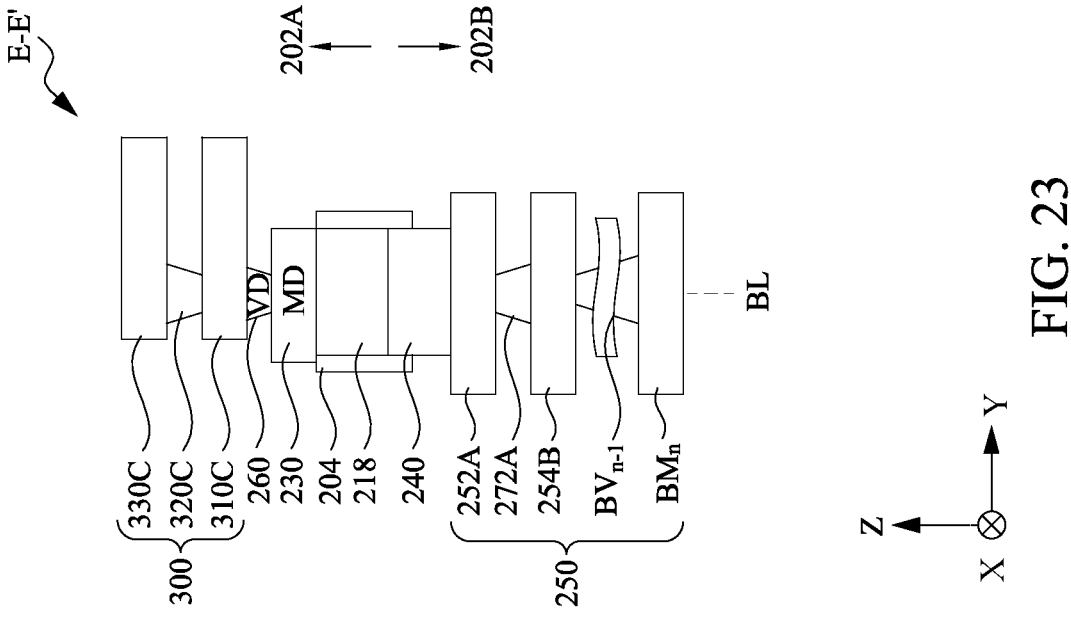
Figure 22:
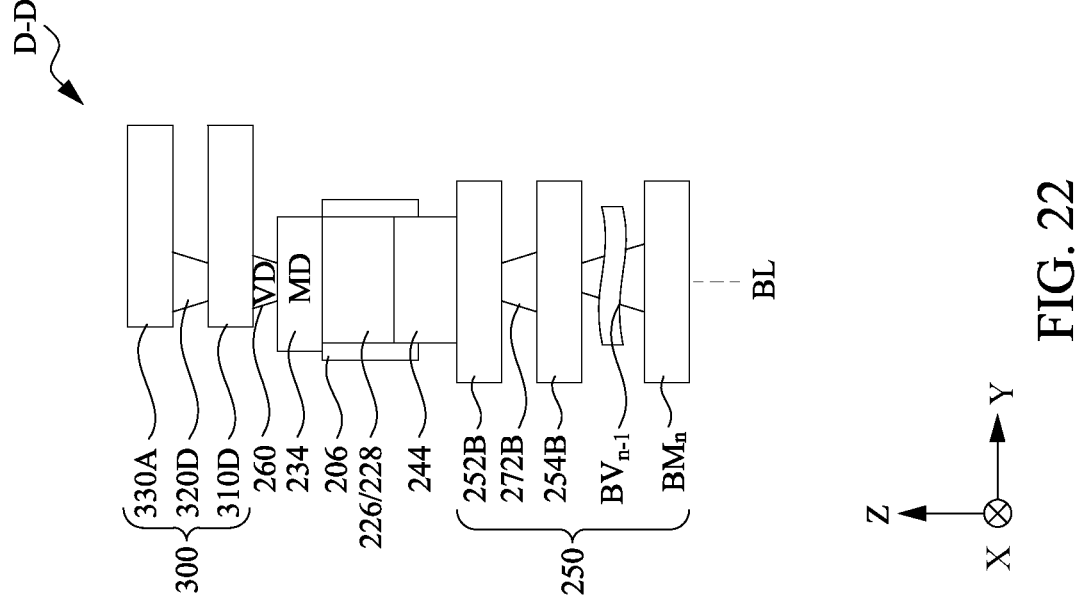

In some embodiments, referring to FIGS. 20-23, the semiconductor device 200 includes a plurality of anti-fuse memory cells 201E, where FIG. 20 depicts a frontside layout design of the anti-fuse memory cell 201E and FIG. 22 depicts a cross-sectional view of the anti-fuse memory cell 201E along the line DD' of FIG. 20. In some embodiments, the anti-fuse memory cell 201E is similar to the anti-fuse memory cell 201A in some aspects. For example, a cross-sectional view of the anti-fuse memory cell 201E along the line CC' and the line EE' in FIGS. 21 and 23, respectively, are similar to those of the anti-fuse memory cell 201A depicted in FIGS. 8 and 10, respectively.

Different from the anti-fuse memory cell 201A depicted in FIG. 4 and the corresponding cross-sectional views, the dummy region 205 of the anti-fuse memory cell 201E does not include any feedthrough via 280. Accordingly, the resistance of the conduction path between the functional transistors T1 and T2, the dummy transistor T3, and the backside interconnect structures 250 in the anti-fuse memory cell 201E may be greater than that of the anti-fuse memory cells 201A-201D. However, omitting the feedthrough vias 280 and 286 can have at least the benefit of reducing complexity and cost of the fabrication process by using one less mask (or photomask) intended for performing a photolithography process in the forming of the feedthrough vias.

Figure 24:
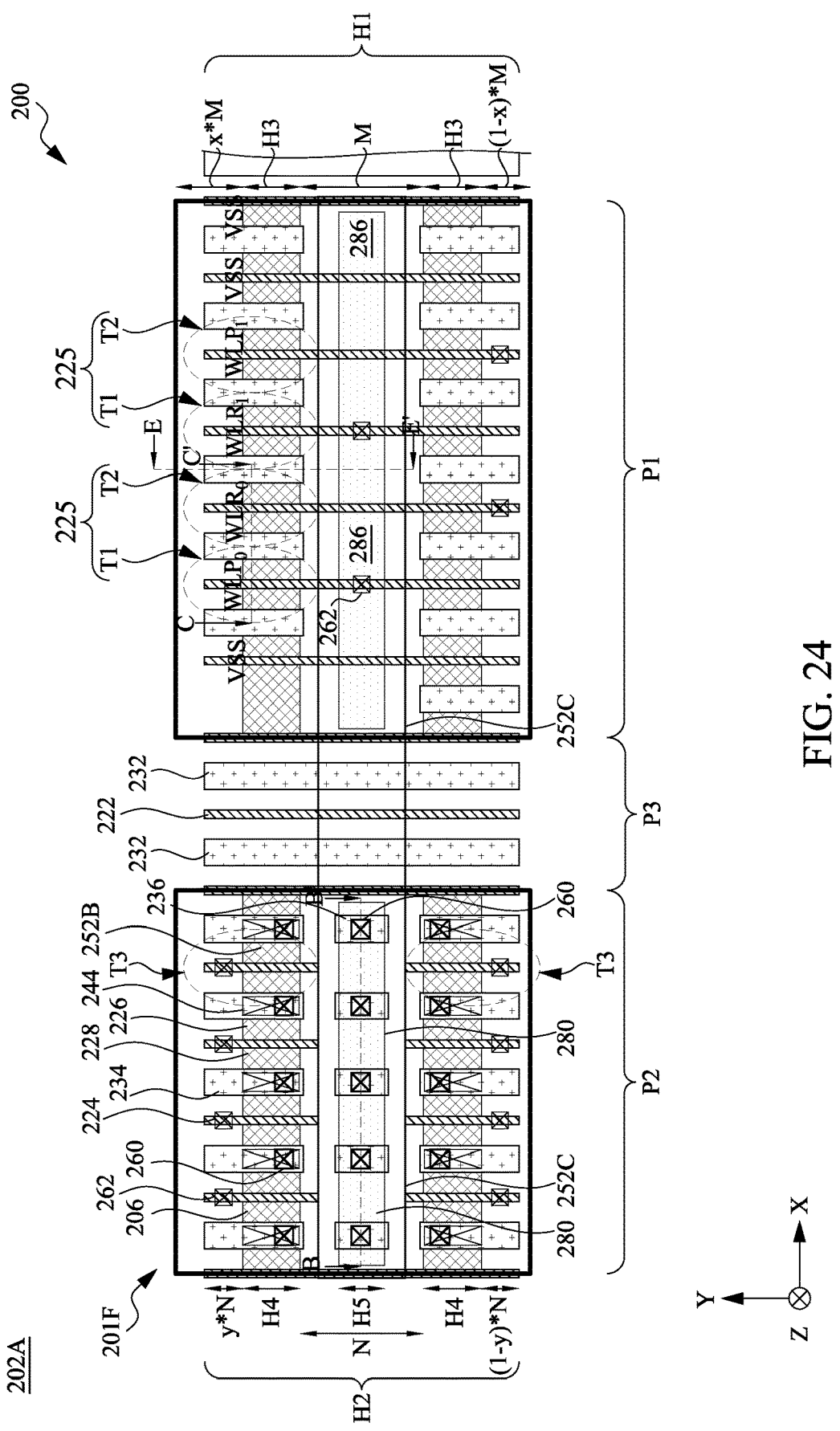
Figures 26, 27:
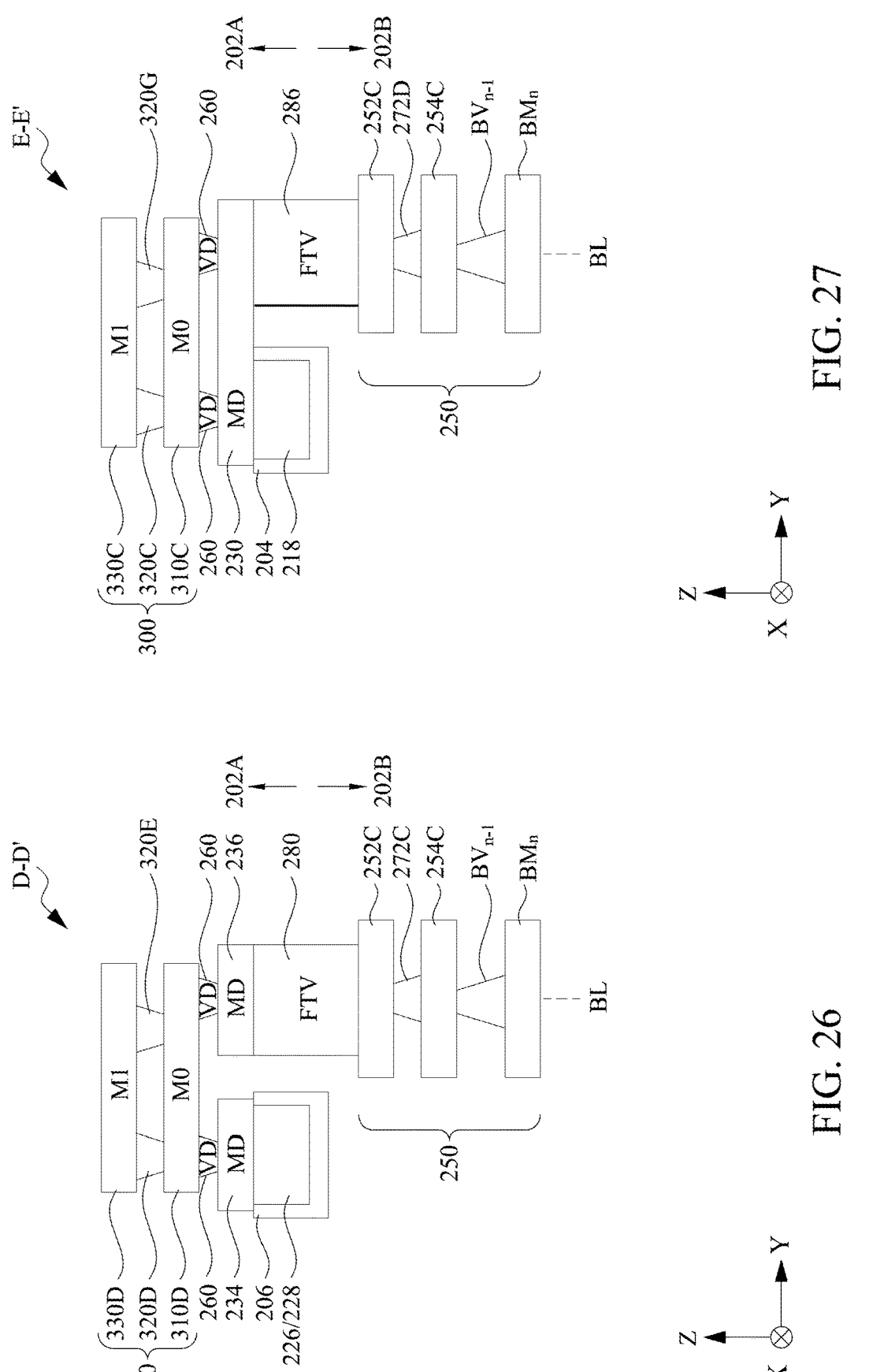

In some embodiments, referring to FIGS. 24-27, the semiconductor device 200 includes a plurality of anti-fuse memory cells 201F, where FIG. 24 depicts a frontside layout design of the anti-fuse memory cell 201F, FIG. 26 depicts a cross-sectional view of the anti-fuse memory cell 201F along the line DD' of FIG. 24, and FIG. 27 depicts a cross-sectional view of the anti-fuse memory cell 201F along the line EE' of FIG. 24. In some embodiments, the anti-fuse memory cell 201F is similar to the anti-fuse memory cell 201B in some aspects. For example, the dummy regions 203 and 205 of the anti-fuse memory cell 201F include the feedthrough vias 280 and 286, respectively.

However, different from the anti-fuse memory cell 201B, both the first region P1 and the second region P2 of the anti-fuse memory cell 201F are free of any backside vias 240 and 244, respectively, that are present in the anti-fuse memory cell 201B. In this regard, while the resistance of the conduction path between the functional transistors T1 and T2, the dummy transistor T3, and the backside interconnect structures 250 in the anti-fuse memory cell 201F may be greater than that of the anti-fuse memory cells 201B, omitting the backside vias 240 and 244 can have at least the benefit of reducing complexity and cost of the fabrication process, similar to the benefit of omitting the feedthrough vias 280 and 286 in the structure of the anti-fuse memory cell 201E.

Figure 28:
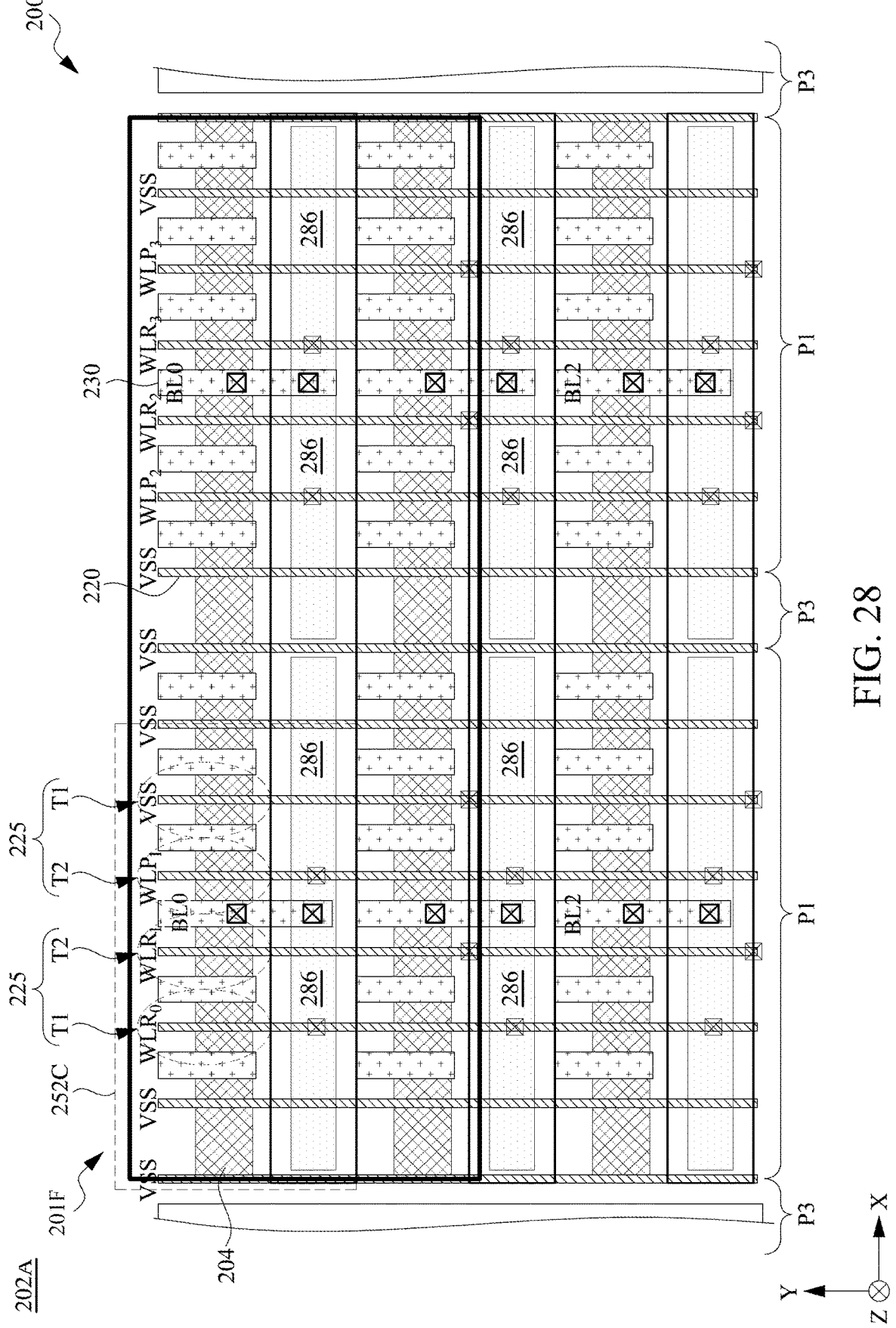

In some embodiments, referring to FIG. 28, the semiconductor device 200 includes a plurality of anti-fuse memory cells 201F. The semiconductor device 200 includes two of the first regions P1 disposed along the first lateral direction and separated by the third region P3. For purposes of simplicity, the second region P2 is omitted in FIG. 28, although it can be disposed adjacent to the third regions P3 in a manner similar to that depicted in any of FIGS. 4, 11, 15, 16, 20, and 24, for example.

In some embodiments, as depicted and described above with reference to FIGS. 24-27, each anti-fuse memory cell 201F includes two unit cells 225 coupled together at the source/drain region 218 of their respective reading transistors T2 by a BL, which is provided on the backside 202B of the substrate 202 and coupled to the frontside 202A of the substrate 202 through at least the feedthrough via 286. In the depicted embodiment, the feedthrough via 286 extends vertically from the metal line 252C of the backside interconnect structures 250, through the substrate 202, to the contact feature 230 (see FIG. 27, for example). Each of the first regions P1 includes four WLs (e.g., $WLP_0$, $WLP_1$, $WLP_2$, and $WLP_3$) coupled to different gate structures (e.g., the gate structures 220; see FIG. 5, for example) and three BLs (e.g., $BL_0$, $BL_1$, and $BL_2$) respectively coupled to the source/drain regions 218 of the reading transistor T2 in the unit cells 225 arranged along the first lateral direction. In this regard, the semiconductor device 200 depicted in FIG. 28 includes a layout having a three (BLs)-by-four (WLs) (3×4) array. In some examples, the semiconductor device 200 may include a plurality of any of the anti-fuse memory cells 201A-201E arranged in such a 3×4 array within the scope of the present disclosure.

Figure 29:
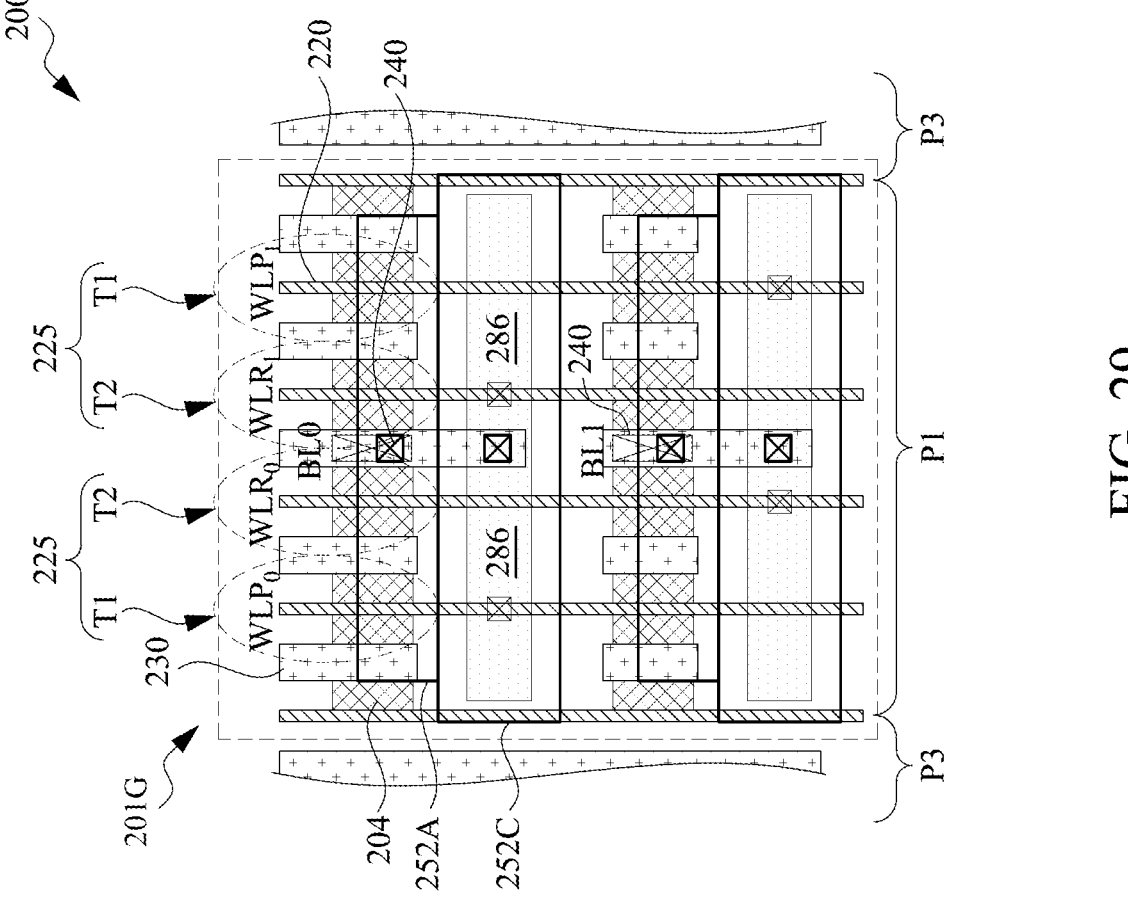

In some embodiments, referring to FIG. 29, the semiconductor device 200 includes a plurality of anti-fuse memory cells 201G. The semiconductor device 200 includes the first region P1 interposed between two of the third region P3 along the first lateral direction. For reasons similar to that stated for FIG. 28, the second region P2 is omitted in FIG. 29, although it can be disposed adjacent to the third regions P3 as described above.

In some embodiments, the anti-fuse memory cell 201G may be similar to the anti-fuse memory cell 201B, 201C, or 201D, as depicted and described above with reference to FIGS. 11-19. In this regard, each anti-fuse memory cell 201G includes two unit cells 225 coupled together at the source/drain region 218 of their respective reading transistors T2 by a BL, which is provided on the backside 202B of the substrate 202 and coupled to the frontside 202A of the substrate 202 through at least the backside via 240 and the feedthrough via 286. In the depicted embodiment, the backside via 240 extends vertically from the metal line 252A of the backside interconnect structures 250, partially through the substrate 202, to contact the source/drain region 218, and the feedthrough via 286 extends vertically from the metal line 252C of the backside interconnect structures 250, through the substrate 202, to the contact feature 230 (see FIG. 14, for example).

The first region P1 includes two WLs (e.g., $WLP_0$ and $WLP_1$) coupled to different gate structures (e.g., the gate structures 220; see FIG. 5, for example) and two BLs (e.g., $BL_0$ and $BL_1$) respectively coupled to the source/drain regions 218 of the reading transistor T2 in the unit cells 225 arranged along the first lateral direction. In this regard, the semiconductor device 200 depicted in FIG. 29 includes a layout having a two (BLs)-by-two (WLs) (2×2) array. In some examples, the semiconductor device 200 may include a plurality of any of the anti-fuse memory cells 201A-201F arranged in such a 2×2 array within the scope of the present disclosure.

Figure 30:
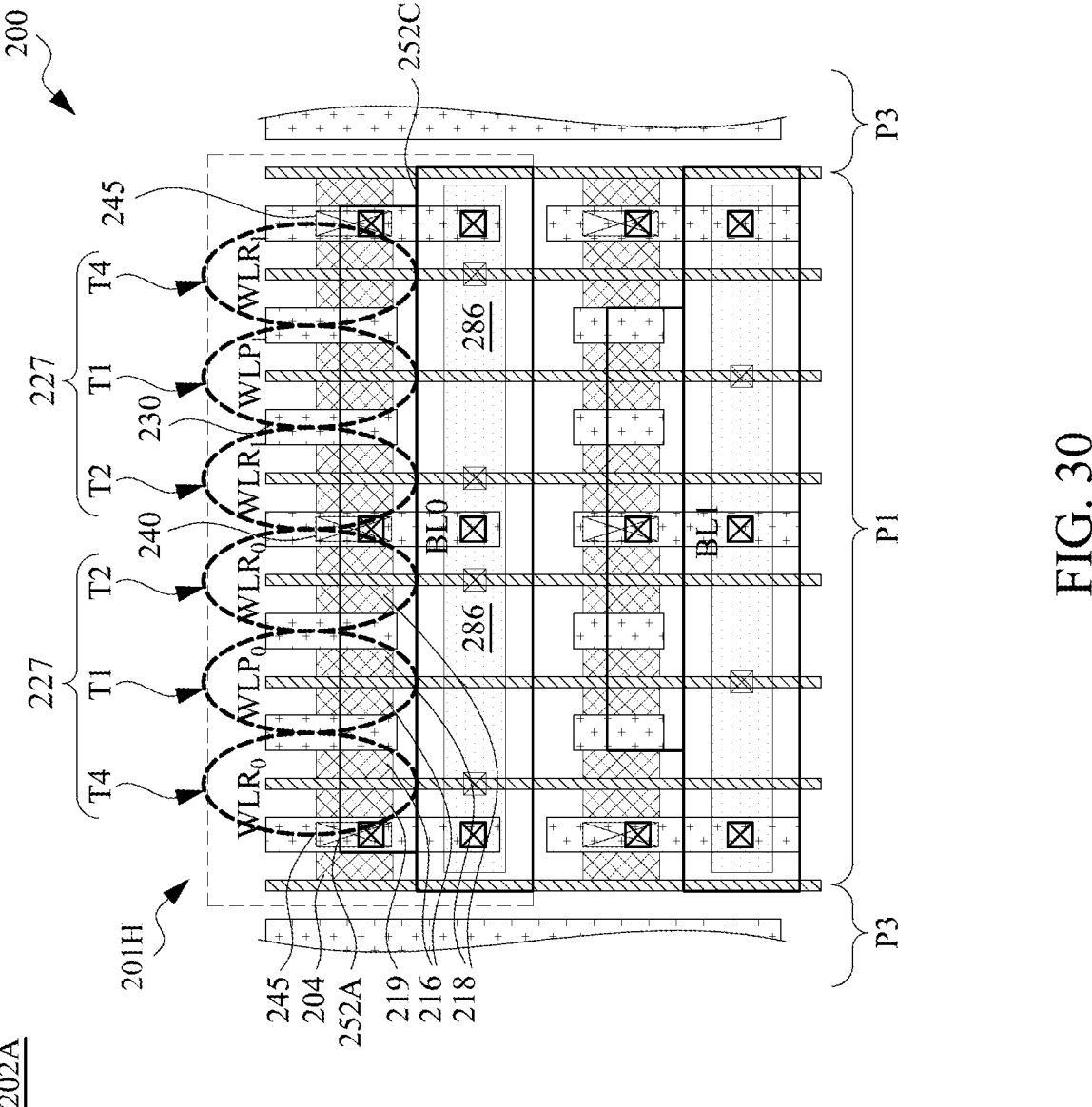

In some embodiments, referring to FIG. 30, the semiconductor device 200 includes a plurality of anti-fuse memory cells 201H. The semiconductor device 200 includes the first region P1 interposed between two of the third region P3 along the first lateral direction. For reasons similar to that stated for FIG. 28, the second region P2 is omitted in FIG. 30, although it can be disposed adjacent to the third regions P3 as described above.

In some embodiments, the anti-fuse memory cell 201H differs from the anti-fuse memory cells 201A-201G described above in that each anti-fuse memory cell 201H includes two unit cells 227 coupled together. Each unit cell 227 is configured as a three-transistor (3T) unit cell that includes a (first) reading transistor T4, the programming transistor T1 (as described above), and the (second) reading transistor T2 (as described above) coupled in series, where the transistors T1, T2, and T4 are collectively referred to as the functional transistors. In the depicted embodiment, the unit cells 227 are coupled together at the source/drain region 218 of their respective reading transistors T2 by a BL, which is provided on the backside 202B of the substrate 202 and coupled to the frontside 202A of the substrate 202 through at least the backside via 240 and the feedthrough via 286. Furthermore, one of source/drain regions 219 of the first reading transistor T4 distal from the programming transistor T1 is also coupled to the BL (e.g., the metal layer 252A) through a backside via 245 that is similar to the backside via 240. In the depicted embodiment, the backside vias 240 and 245 each extend vertically from the metal line 252A of the backside interconnect structures 250, partially through the substrate 202, to contact the source/drain regions 218 and 219, respectively, and the feedthrough via 286 extends vertically from the metal line 252C of the backside interconnect structures 250, through the substrate 202, to the contact feature 230. In this regard, the read current increases when the anti-fuse memory cell 201H is in an unprogrammed state (i.e., before breaking down the gate dielectric of the programming transistor T1), leading to a larger read window.

The first region P1 includes two WLs (e.g., $WLP_0$ and $WLP_1$) coupled to different gate structures (e.g., the gate structures 220; see FIG. 5, for example) and two BLs (e.g., $BL_0$ and $BL_1$) respectively coupled to the source/drain region 218 of the reading transistor T2 and the source/drain region 219 of first reading transistor T4 in each of the unit cells 227. In this regard, the semiconductor device 200 depicted in FIG. 30 includes a layout having a two (BLs)-by-two (WLs) (2×2) array.

Figure 31:
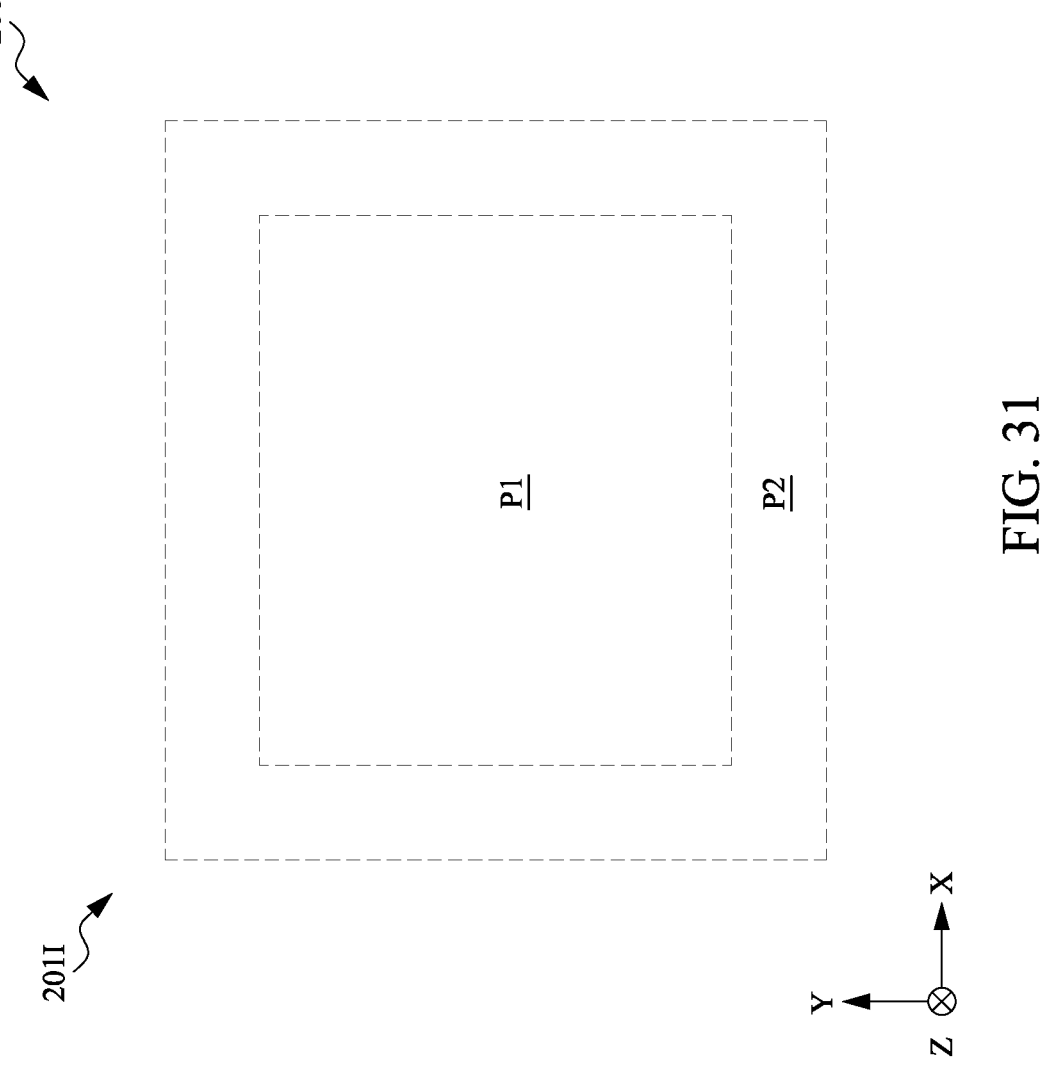
FIG. 31 illustrates a schematic top view of an example memory cell, in accordance with some embodiments.

FIG. 31 depicts a schematic top view of an anti-fuse memory cell 201I. The anti-fuse memory cell 201I may be similar to any one of the anti-fuse memory cells 201A-201H as described above with the exception that the second region P2 surrounds or encloses the first region P1, rather than extends alongside the first region P1 as depicted in the anti-fuse memory cells 201A-201F. In this regard, the second region P2 may operatively serve as a guard ring structure coupled to the first region P1.

Figure 32:
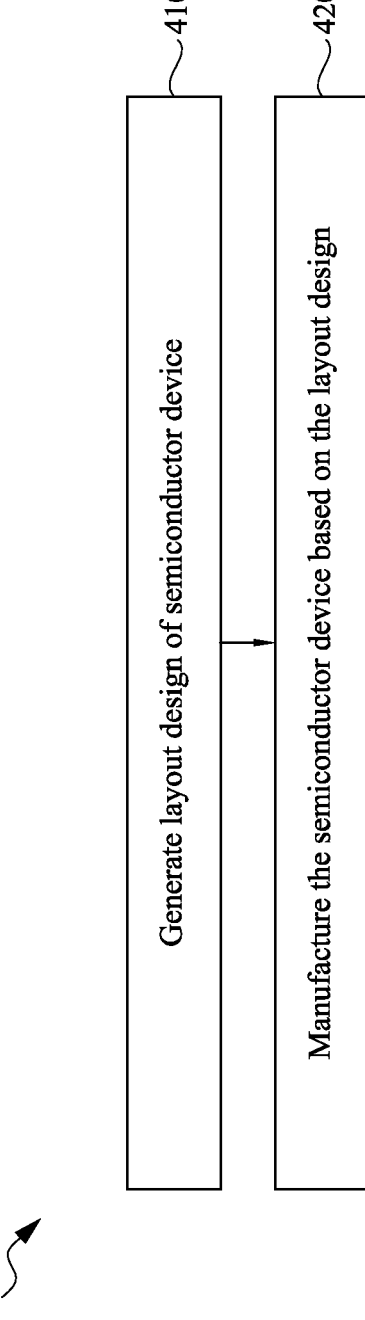
FIG. 32 illustrates a flowchart of a method of manufacturing a semiconductor device, in accordance with some embodiments.

FIG. 32 is a flowchart of a method 400 of forming or manufacturing a semiconductor device, such as the semiconductor device 200, in accordance with some embodiments. It is understood that additional operations may be performed before, during, and/or after the method 400 depicted in FIG. 32. In some embodiments, the method 400 is usable to form a semiconductor device, according to various layouts (designs) as disclosed herein.

In operation 410 of the method 400, a layout design of a semiconductor device (e.g., the semiconductor device 200 having a layout corresponding to the structure of any of the anti-fuse memory cells 201A-201I; see FIGS. 4-31) is generated. The operation 410 is performed by a processing device (e.g., processor 502 of FIG. 33) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system (GDSII) file format.

In operation 420 of the method 400, a semiconductor device is manufactured based on the layout design. In some embodiments, the operation 420 of the method 400 includes manufacturing at least one mask based on the layout design, and manufacturing a semiconductor device based on the at least one mask. A number of example manufacturing operations of the operation 420 will be discussed with respect to the method 700 of FIG. 35 below.

In some embodiments, the method 400 is implemented as a standalone software application for execution by a processor. In some embodiments, the method 400 is implemented as a software application that is a part of an additional software application. In some embodiments, the method 400 is implemented as a plug-in to a software application. In some embodiments, the method 400 is implemented as a software application that is a portion of an EDA tool. In some embodiments, the method 400 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated based on a netlist which is created based on the schematic design.

Figure 33:
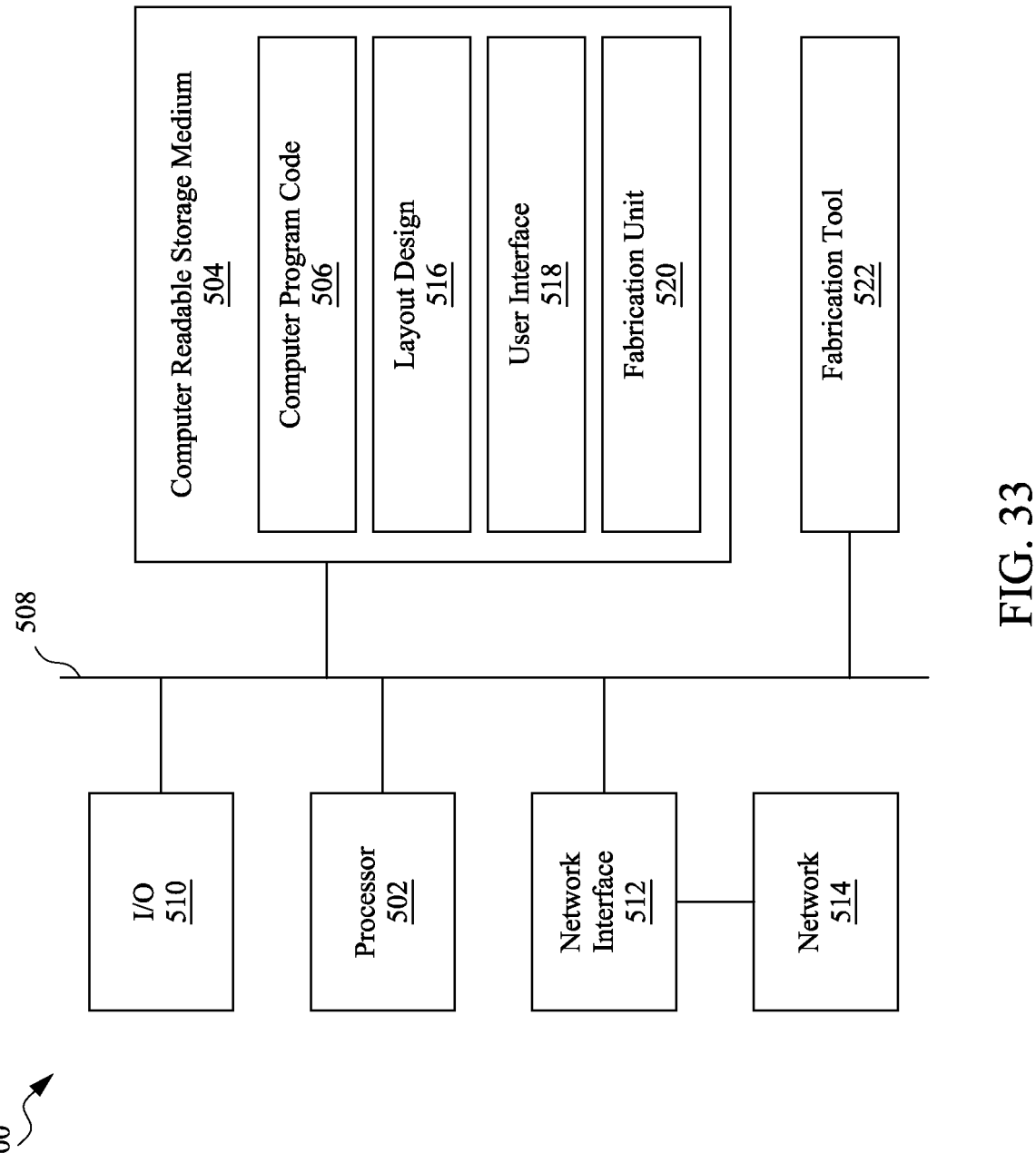
FIG. 33 illustrates a block diagram of a system of generating an IC layout design, in accordance with some embodiments.

FIG. 33 is a schematic view of a system 500 for designing and manufacturing an IC layout design, in accordance with some embodiments. The system 500 generates or places one or more IC layout designs, as described herein. In some embodiments, the system 500 manufactures one or more semiconductor devices based on the one or more IC layout designs, as described herein. The system 500 includes a (e.g., hardware) processor 502 and a non-transitory, computer readable storage medium 504 encoded with, e.g., storing, computer program code 506, e.g., a set of executable instructions. The computer readable storage medium 504 is configured to interface with manufacturing machines for producing the semiconductor device. The processor 502 is electrically coupled to the computer readable storage medium 504 by a bus 508. The processor 502 is also electrically coupled to an I/O interface 510 by the bus 508. A network interface 512 is also electrically connected to the processor 502 by the bus 508. Network interface 512 is connected to a network 514, so that the processor 502 and the computer readable storage medium 504 can connect to external elements via network 514. The processor 502 is configured to execute the computer program code 506 encoded in the computer readable storage medium 504 to cause the system 500 to be usable for performing a portion or all of the operations as described in method 400.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random-access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the computer readable storage medium 504 stores the computer program code 506 configured to cause the system 500 to perform the method 400. In some embodiments, the computer readable storage medium 504 also stores information needed for performing the method 400 as well as information generated during the performance of the method 400, such as layout design 516, user interface 518, fabrication unit 520, and/or a set of executable instructions to perform the operation of method 400.

In some embodiments, the computer readable storage medium 504 stores instructions (e.g., the computer program code 506) for interfacing with manufacturing machines. The instructions (e.g., the computer program code 506) enable the processor 502 to generate manufacturing instructions readable by the manufacturing machines to effectively implement the method 400 during a manufacturing process.

The system 500 includes the I/O interface 510. The I/O interface 510 is coupled to external circuitry. In some embodiments, the I/O interface 510 includes a keyboard, keypad, mouse, trackball, trackpad, and/or cursor direction keys for communicating information and commands to the processor 502.

The system 500 also includes the network interface 512 coupled to the processor 502. The network interface 512 allows the system 500 to communicate with the network 514, to which one or more other computer systems are connected. The network interface 512 includes wireless network interfaces such as BLUETOOTH, WIFI, WIMAX, GPRS, or WCDMA; or wired network interface such as ETHERNET, USB, or IEEE-13154. In some embodiments, the method 400 is implemented in two or more systems 500, and information such as layout design, user interface and fabrication unit are exchanged between different systems 500 by the network 514.

The system 500 is configured to receive information related to a layout design through the I/O interface 510 or network interface 512. The information is transferred to the processor 502 by the bus 508 to determine a layout design for producing an IC. The layout design is then stored in the computer readable storage medium 504 as the layout design 516. The system 500 is configured to receive information related to a user interface through the I/O interface 510 or network interface 512. The information is stored in the computer readable storage medium 504 as the user interface 518. The system 500 is configured to receive information related to a fabrication unit through the I/O interface 510 or network interface 512. The information is stored in the computer readable storage medium 504 as the fabrication unit 520. In some embodiments, the fabrication unit 520 includes fabrication information utilized by the system 500.

In some embodiments, the method 400 is implemented by a manufacturing device to manufacture an integrated circuit using a set of masks manufactured based on one or more layout designs generated by the system 500. In some embodiments, the system 500 includes a manufacturing device (e.g., fabrication tool 522) to manufacture an integrated circuit using a set of masks manufactured based on one or more layout designs of the present disclosure. In some embodiments, the system 500 of FIG. 26 generates layout designs of an IC that are smaller than other approaches. In some embodiments, the system 500 of FIG. 33 generates layout designs of a semiconductor device that occupy less area than other approaches.

Figure 34:
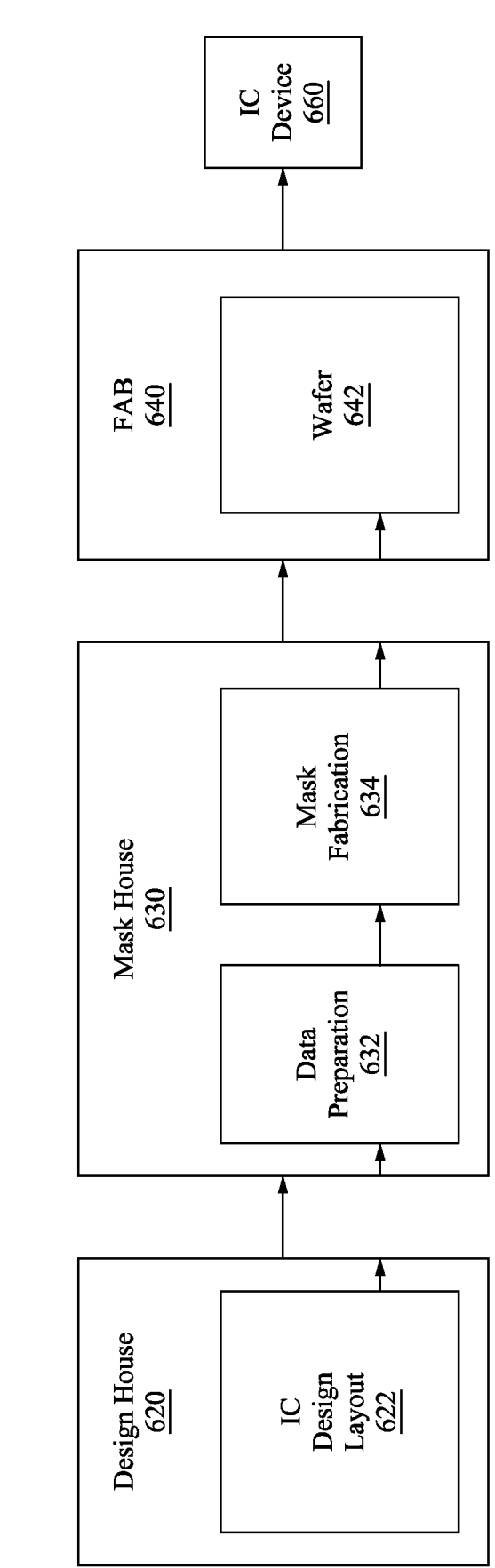
FIG. 34 illustrates a block diagram of an IC manufacturing system, and an IC manufacturing flow associated therewith, in accordance with some embodiments.

FIG. 34 is a block diagram of an integrated circuit (IC)/semiconductor device manufacturing system 600, and an IC manufacturing flow associated therewith, in accordance with at least one embodiment of the present disclosure.

In FIG. 34, the IC manufacturing system 600 includes entities, such as a design house 620, a mask house 630, and an IC manufacturer/fabricator ("fab") 640, that interact with one another in the design, development, and manufacturing cycles and/or services related to manufacturing an IC device (semiconductor device) 660 (e.g., corresponding to the semiconductor device 200). The entities in the IC manufacturing system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 640 is owned by a single company. In some embodiments, two or more of design house 620, mask house 630, and IC fab 640 coexist in a common facility and use common resources.

The design house (or design team) 620 generates an IC design layout 622. The IC design layout 622 includes various geometrical patterns designed for the IC device 660. The geometrical patterns correspond to patterns of metal, oxide, or semiconductor layers that make up the various components of the IC device 660 to be fabricated. The various layers combine to form various IC features. For example, a portion of the IC design layout 622 includes various IC features, such as an active region, gate structures, source/drain regions, interconnect structures, and openings for bonding pads, to be formed in a semiconductor substrate (such as a silicon wafer) and various material layers disposed on the semiconductor substrate. The design house 620 implements a proper design procedure to form the IC design layout 622. The design procedure includes one or more of logic design, physical design or place and route. The IC design layout 622 is presented in one or more data files having information of the geometrical patterns. For example, the IC design layout 622 can be expressed in a GDSII file format or DFII file format.

The mask house 630 includes mask data preparation 632 and mask fabrication 634. The mask house 630 uses the IC design layout 622 to manufacture one or more masks to be used for fabricating the various layers of the IC device 660 according to the IC design layout 622. The mask house 630 performs the mask data preparation 632, where the IC design layout 622 is translated into a representative data file ("RDF"). The mask data preparation 632 provides the RDF to the mask fabrication 634. The mask fabrication 634 includes a mask writer. A mask writer converts the RDF to an image on a substrate, such as a mask (reticle) or a semiconductor wafer. The design layout is manipulated by the mask data preparation 632 to comply with particular characteristics of the mask writer and/or requirements of the IC fab 640. In FIG. 34, the mask data preparation 632 and mask fabrication 634 are illustrated as separate elements. In some embodiments, the mask data preparation 632 and mask fabrication 634 can be collectively referred to as mask data preparation.

In some embodiments, the mask data preparation 632 includes optical proximity correction (OPC) which uses lithography enhancement techniques to compensate for image errors, such as those that can arise from diffraction, interference, other process effects and the like. OPC adjusts the IC design layout 622. In some embodiments, the mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 632 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during the mask fabrication 634, which may undo part of the modifications performed by OPC in order to meet mask creation rules.

In some embodiments, the mask data preparation 632 includes lithography process checking (LPC) that simulates processing that will be implemented by the IC fab 640 to fabricate the IC device 660. LPC simulates this processing based on the IC design layout 622 to create a simulated manufactured device, such as the IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the IC design layout 622.

It should be understood that the above description of the mask data preparation 632 has been simplified for the purposes of clarity. In some embodiments, the mask data preparation 632 includes additional features such as a logic operation (LOP) to modify the IC design layout according to manufacturing rules. Additionally, the processes applied to the IC design layout 622 during the mask data preparation 632 may be executed in a variety of different orders.

After the mask data preparation 632 and during mask fabrication 634, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by the mask fabrication 634 is used in a variety of processes. For example, such a mask(s) is used in an ion implantation process to form various doped regions in the semiconductor wafer, in an etching process to form various etching regions in the semiconductor wafer, and/or in other suitable processes.

The IC fab 640 is an IC fabrication entity that includes one or more manufacturing facilities for the fabrication of a variety of different IC products. In some embodiments, the IC fab 640 is a semiconductor foundry. For example, there may be a first manufacturing facility for the front end fabrication of a plurality of IC products (e.g., source/drain regions, gate structures), while a second manufacturing facility may provide the middle end fabrication for the interconnection of the IC products (e.g., contact features, vias, gate contacts, etc.) and a third manufacturing facility may provide the back end fabrication for the interconnection and packaging of the IC products (e.g., the frontside metallization layers, such as $M_0$, $M_1$, $M_2$, . . . , and $M_n$, the backside metallization layers, such as $BM_0$, $BM_1$, . . . and $BM_n$, etc., the vias, such as $V_0$, $V_1$, $V_2$, . . . and $V_{n-1}$, and the vias, such as $BV_0$, $BV_1$, . . . and $BV_{n-1}$, etc.), and a fourth manufacturing facility may provide other services for the foundry entity.

The IC fab 640 uses the mask (or masks) fabricated by the mask house 630 to fabricate the IC device 660. Thus, the IC fab 640 at least indirectly uses the IC design layout 622 to fabricate the IC device 660. In some embodiments, a semiconductor wafer 642 is fabricated by the IC fab 640 using the mask (or masks) to form the IC device 660. The semiconductor wafer 642 includes a silicon substrate or other proper substrate having material layers formed thereon. Semiconductor wafer further includes one or more of various doped regions, dielectric features, multilevel interconnects, and the like (formed at subsequent manufacturing steps).

The IC manufacturing system 600 is shown as having the design house 620, mask house 630, and IC fab 640 as separate components or entities. However, it should be understood that one or more of the design house 620, mask house 630, and IC fab 640 are part of the same component or entity.

FIG. 35 is a flowchart illustrating an example method 700 for fabricating a semiconductor device that includes the disclosed anti-fuse memory cells (e.g., the anti-fuse memory cells 201A-201I) and the backside power rails (e.g., backside interconnect structures 250 for providing the voltage at the BL) coupled to the anti-fuse memory cell, according to various aspects of the present disclosure. The method 700 may be part of the operation 420 of the method 400 (FIG. 32). As such, the semiconductor device may be made based on at least a portion of the layout design disclosed herein.

At least some operations of the method 700 can be used to form a semiconductor device in a non-planar transistor configuration. For example, the semiconductor device may include one or more FinFETs or GAA FETs. However, it should be understood that the transistors of the semiconductor device may be each configured in any of various other types of transistors such as, for example, a complementary FET (CFET), while remaining within the scope of the present disclosure. It should be noted that the method 700 is merely an example and is not intended to limit the present disclosure. Accordingly, it should be understood that additional operations may be provided before, during, and/or after the method 700, and that some other operations may only be briefly described herein. The following discussions of the method 700 may refer to one or more components of FIGS. 1-31.

In brief overview, the method 700 starts with operation 702 of providing a semiconductor substrate that includes a first portion and a second portion adjacent to the first portion. The method 700 proceeds to operation 704 of forming, on a frontside of the semiconductor substrate, a first transistor and a second transistor in the first portion and a third transistor in the second portion, where the first transistor and the second transistor are coupled in series to form an anti-fuse memory cell. The method 700 proceeds to operation 706 of forming, on the frontside, first interconnect structures coupled to the first, the second, and the third transistors. The method 700 proceeds to operation 708 of forming, on a backside of the semiconductor substrate, first via structures coupled to a portion of each of the second and the third transistors. The method 700 proceeds to operation 710 of forming, on the backside, a second via structure adjacent to the third transistor in the second portion, the second via structure coupled to the first interconnect structures. The method 700 proceeds to operation 712 of forming, on the backside, second interconnect structures coupled to the first and second via structures.

In various embodiments, the first and second transistors (e.g., the functional transistors T1, T2, and T4) and first interconnect structures (e.g., the frontside interconnect structures 300) on the frontside (e.g., the frontside 202A) of the semiconductor substrate (e.g., the substrate 202) form a number of the disclosed anti-fuse memory cells (e.g., the anti-fuse memory cells 201A-201I), and the second interconnect structures (e.g., backside interconnect structures 250) on the backside (e.g., the backside 202B) of the semiconductor substrate are power rails operatively serving as a BL, which is coupled to the anti-fuse memory cells on the frontside through a plurality of first via structures (e.g., the backside vias 240, 244, and 245) and/or the second via structures (e.g., the feedthrough vias 280 and 286).

Corresponding to operation 702, the semiconductor substrate (e.g., the substrate 202) may include a bulk semiconductor, a semiconductor-on-insulator (SOI) substrate, or the like, which may be doped (e.g., with a p-type or an n-type dopant) or undoped. The semiconductor substrate may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor substrate includes the first portion (e.g., the first region P1) and the second portion (e.g., the second region P2).

Corresponding to operation 704, on the frontside of the semiconductor substrate (e.g., in both the first region P1 and the second region P2), a number of transistors, including the first and the second transistors (e.g., the functional transistors T1, T2, and T4) and third transistors (e.g., the dummy transistors T3) are formed in the first portion and the second portion, respectively. In the present embodiments, the first, the second, and the third transistors are arranged along a first direction (e.g., the first lateral direction or the X axis). The first and the second transistors are formed in series to form an anti-fuse memory cell (e.g., the anti-fuse memory cells 201A-201I) on the frontside. Using a FinFET as an example embodiment of the transistor, the transistor may be formed by at least some of the following process steps: forming a fin structure (e.g., the active region 204 or 206) protruding from the semiconductor substrate; forming a dummy gate structure (not depicted herein) straddling a channel region of the fin structure; forming gate spacers (not depicted herein) disposed along opposite sidewalls of the dummy gate structure; forming source/drain regions (e.g., the source/drain regions 216/218/219 and 226/228) in the fin structure that are disposed on opposite sides of the dummy gate structure; removing the dummy gate structure; and forming an active (e.g., metal) gate structure (e.g., the gate structure 220 or 224) in place of the dummy gate structure.

Corresponding to operation 706, on the frontside of the semiconductor substrate, the first interconnect structures (e.g., the frontside interconnect structures 300) are formed. The first interconnect structures can include a number of middle-end-of-line (MEOL) interconnect structures (e.g., the source/drain contacts 230 and 234, contact features 236 and 238; the vias 260; the gate contacts 262, etc.), and a number of back-end-of-line (BEOL) interconnect structures (e.g., the frontside metallization layers, such as $M_0$, $M_1$, $M_2$, . . . , and $M_n$, and the vias, such as $V_0$, $V_1$, $V_2$, . . . and $V_{n-1}$, etc.), as described above. In some embodiments, the MEOL and BEOL interconnect structures can each extend along in a single direction. For example, the source/drain contacts 230 and 234 and the contact features 236 and 238 may all extend along the second lateral direction in parallel with the gate structures 220, 222, and 224. The first interconnect structures may be formed by at least some of the following steps: forming a dielectric layer over the transistors on the frontside; patterning the dielectric layer to form opening corresponding to positions of various components of the first interconnect structures; and forming conductive (e.g., metal) structures in the openings, resulting in the first interconnect structures. Each of the first interconnect structures disposed on the frontside can include one or more metal materials such as, for example, tungsten (W), copper (Cu), gold (Au), cobalt (Co), ruthenium (Ru), or combinations thereof, disposed in a dielectric material (e.g., an ILD layer, an IMD layer, etc.; not depicted herein).

Corresponding to operations 708 and 710 collectively, on the backside (e.g., the backside 202B) of the semiconductor substrate, a plurality of via structures, including the first via structures (e.g., the backside vias 240, 244, and 245) and the second via structure (e.g., the feedthrough vias 280 and 286), are formed in connection with portions of components formed on the frontside of the semiconductor substrate. At operation 708, the first via structures are coupled to each of the second and the third transistors (e.g., the functional transistor T2 and the dummy transistor T3, respectively). At operation 710, the second via structure extends along the first direction (e.g., the first lateral direction or the X axis) in the second portion (e.g., the second region P2) and adjacent to the third transistor (e.g., the dummy transistor T3) along a second direction (e.g., the second lateral direction or the Y axis) perpendicular to the first direction. The second via structure is coupled to the first interconnect structures.

The first and the second via structures may be formed by at least some of the following processing steps: flipping the semiconductor substrate; optionally thinning down the semiconductor substrate from the backside until bottom surfaces of the source/drain regions (e.g., source/drain regions 216/218/219 and 226/228) are exposed; forming a dielectric layer over the backside; patterning the dielectric layer to form openings corresponding to positions of the backside vias and the feedthrough vias; and forming conductive (e.g., metal) structures in the openings, resulting in the via structures on the backside. The resulting backside vias (e.g., the backside vias 240, 244, and 245) are each coupled to one of the source/drain regions of each transistor and the resulting feedthrough vias (e.g., the feedthrough vias 280 and 286) are each coupled to a contact feature (e.g., the contact feature 236). Each of the feedthrough vias has a larger cross-sectional area, and thus lower resistance, than the backside via.

Corresponding to operation 712, on the backside of the semiconductor substrate, the second interconnect structures (e.g., backside interconnect structures 250) are formed. In the present embodiments, the second interconnect structures function as power rails operatively serving as the BL coupled to the anti-fuse memory cells from the backside. The second interconnect structures extend along the first direction and are coupled to the first via structures (e.g., the backside vias 240, 244, and 245) and the second via structures (e.g., the feedthrough vias 280 and 286). The second interconnect structures are formed in a manner similar to that of forming the first interconnect structures and in connection with each of the via structures formed at operation 708. Each of the second interconnect structures disposed on the backside can include one or more metal materials such as, for example, tungsten (W), copper (Cu), gold (Au), cobalt (Co), Ruthenium (Ru), or combinations thereof.

In one aspect of the present disclosure, a memory device is disclosed. The memory device includes a memory cell including a first transistor and a second transistor both disposed on a first side of a substrate. The memory device includes a first interconnect structure disposed on a second side of the substrate opposite to the first side. A first source/drain terminal of the first transistor is floating, a second source/drain terminal of the first transistor is coupled to a first source/drain terminal of the second transistor, with a second source/drain terminal of the second transistor coupled to the first interconnect structure. The memory device includes a first via structure disposed in a first area of the substrate and configured to couple the second source/drain terminal of the second transistor to the first interconnect structure. The memory device includes a plurality of second via structures disposed in a second area of the substrate and each coupled to the first interconnect structure. The memory device includes a third via structure disposed in the second area of the substrate and each coupled to the first interconnect structure. The first via structure and the second via structures each have a first cross-sectional area, and the third via structure has a second cross-sectional area different from the first cross-sectional area.

In another aspect of the present disclosure, a semiconductor device is disclosed. The semiconductor device includes a substrate including a first area and a second area, the first area and the second area each extending lengthwise along a first direction and widthwise along a second direction that is perpendicular to the first direction. The semiconductor device includes a first active region disposed in the first area and on a frontside of the substrate, the first active region extending lengthwise along the first direction. The semiconductor device includes a first transistor and a second transistor disposed in the first active region and coupled in series. The semiconductor device includes a first interconnect structure formed on the frontside of the substrate and coupled to the first transistor and the second transistor. The semiconductor device includes a second interconnect structure formed on a backside of the substrate opposite to the frontside. The semiconductor device includes a first via structure coupling a portion of the second transistor to the second interconnect structure. The semiconductor device includes a second active region disposed in the second area and on the first side of the substrate, the second active region extending lengthwise along the first direction. The semiconductor device includes a plurality of second via structures each coupling a portion of the second active region to the second interconnect structure. The semiconductor device includes a third via structure coupling the first interconnect structure to the second interconnect structure in the second area. The first via structure and the second via structure each extend a first length along the first direction. The third via structure extends a second length along the first direction, the second length being longer than the first length.

In yet another aspect of the present disclosure, a method for fabricating a memory device is disclosed. The method includes providing a substrate having a first portion and a second portion adjacent to the first portion. The method includes forming, on a frontside of the substrate, a first transistor and a second transistor in the first portion and a third transistor in the second portion. The first transistor and the second transistor are coupled in series to form an anti-fuse memory cell. The first transistor, the second transistor, and the third transistor are arranged along a first direction. The method includes forming, on the frontside of the substrate, first interconnect structures coupled to the first transistor, the second transistor, and the third transistor. The method includes forming, on a backside of the substrate opposite to the frontside, first via structures respectively coupled to a portion of each of the second transistor and the third transistor. The method includes forming, on the backside of the substrate, a second via structure extending along the first direction in the second portion. The second via structure is coupled to the first interconnect structures and formed adjacent to the third transistor along a second direction perpendicular to the first direction. The method includes forming, on the backside of the substrate, second interconnect structures extending along the first direction and coupled to the first via structures and the second via structure.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a memory cell including a first transistor and a second transistor both disposed on a first side of a substrate;
a first interconnect structure disposed on a second side of the substrate opposite to the first side, wherein a first source/drain terminal of the first transistor is floating, a second source/drain terminal of the first transistor is coupled to a first source/drain terminal of the second transistor, with a second source/drain terminal of the second transistor coupled to the first interconnect structure;
a first via structure disposed in a first area of the substrate and configured to couple the second source/drain terminal of the second transistor to the first interconnect structure;
a plurality of second via structures disposed in a second area of the substrate and each coupled to the first interconnect structure; and
a third via structure disposed in the second area of the substrate and coupled to the first interconnect structure,
wherein the first via structure and the second via structures each have a first cross-sectional area, and the third via structure has a second cross-sectional area that is different from the first cross-sectional area.

2. The device of claim 1, wherein the first interconnect structure operatively serves as a bit line for the memory cell.

3. The device of claim 1, wherein a conduction path is formed by applying a programming voltage on a gate terminal of the first transistor.

4. The device of claim 3, wherein the conduction path extends from the gate terminal of the first transistor, through at least the second source/drain terminal of the first transistor, the first and the second source/drain terminals of the second transistor, and to the first interconnect structure.

5. The device of claim 1, wherein the first via structure, the second via structures, and the third via structure are coupled in parallel with one another.

6. The device of claim 1, wherein the first cross-sectional area is less than the second cross-sectional area.

7. The device of claim 1, further comprising a second interconnect structure disposed on the first side, wherein the first via structure, the second via structures, and the third via structure are respectively coupled to the second interconnect structure.

8. The device of claim 1, wherein at least a portion of the second area extends adjacent to the first area.

9. The device of claim 1, wherein the memory cell is disposed in the first area, the device further comprising a plurality of third transistors disposed in the second area, wherein a gate terminal and source/drain terminals of each of the third transistors are coupled to the first interconnect structure.

10. The device of claim 7, further comprising at least one fourth via structure coupling the first interconnect structure to the second interconnect structure in the first area.

11. The device of claim 1, further comprising a third transistor, wherein the second via structures couple both source/drain regions of the third transistor to a second interconnect structure.

12. A device, comprising:
  a memory cell including a first transistor and a second transistor both disposed a substrate;
  a first interconnect structure disposed on the substrate, wherein a first source/drain terminal of the first transistor is floating, a second source/drain terminal of the first transistor is coupled to a first source/drain terminal of the second transistor, with a second source/drain terminal of the second transistor coupled to the first interconnect structure;
  a first via structure disposed in a first area of the substrate and configured to couple the second source/drain terminal of the second transistor to the first interconnect structure;
  a plurality of second via structures disposed in a second area of the substrate and each coupled to the first interconnect structure; and a third via structure disposed in the second area of the substrate and coupled to the first interconnect structure,
  wherein the first via structure and the second via structures each have a first resistance, and the third via structure has a second resistance that is lower than the first resistance.

13. The device of claim 12, wherein the first interconnect structure operatively serves as a bit line for the memory cell.

14. The device of claim 12, wherein a conduction path is formed by applying a programming voltage on a gate terminal of the first transistor.

15. The device of claim 14, wherein the conduction path extends from the gate terminal of the first transistor, through at least the second source/drain terminal of the first transistor, the first and the second source/drain terminals of the second transistor, and to the first interconnect structure.

16. The device of claim 12, wherein the first via structure, the second via structures, and the third via structure are coupled in parallel with one another.

17. The device of claim 12, wherein the first via structure and the second via structures each have a first cross-sectional area, and the third via structure has a second cross-sectional area that is different from the first cross-sectional area, and wherein the first cross-sectional area is less than the second cross-sectional area.

18. The device of claim 12, further comprising a second interconnect structure disposed on the substrate, wherein the first via structure, the second via structures, and the third via structure are respectively coupled to the second interconnect structure.

19. The device of claim 12, wherein at least a portion of the second area extends adjacent to the first area.

20. The device of claim 12, wherein the memory cell is disposed in the first area, the device further comprising a plurality of third transistors disposed in the second area, wherein a gate terminal and source/drain terminals of each of the third transistors are coupled to the first interconnect structure.

* * * * *